United States Patent [19]
Glavish

[11] Patent Number: 5,132,544
[45] Date of Patent: Jul. 21, 1992

[54] SYSTEM FOR IRRADIATING A SURFACE WITH ATOMIC AND MOLECULAR IONS USING TWO DIMENSIONAL MAGNETIC SCANNING

[75] Inventor: Hilton F. Glavish, Incline Village, Nev.

[73] Assignee: Nissin Electric Company Ltd., Kyoto, Japan

[21] Appl. No.: 575,498

[22] Filed: Aug. 29, 1990

[51] Int. Cl.$^5$ .......................................... H01J 37/317
[52] U.S. Cl. ................. 250/492.2; 250/348; 335/210; 335/213
[58] Field of Search ............ 250/492.21, 492.2, 492.3, 250/398; 335/213, 210

[56] References Cited

U.S. PATENT DOCUMENTS

| | | | |
|---|---|---|---|
| 2,260,725 | 10/1941 | Richards et al. | 335/210 |
| 3,569,757 | 3/1971 | Brewer et al. | |
| 4,063,098 | 12/1977 | Enge | 250/396 R |
| 4,140,913 | 2/1979 | Anger et al. | 250/492.2 |
| 4,234,797 | 11/1980 | Ryding | 250/492.2 |
| 4,276,477 | 6/1981 | Enge | |
| 4,367,411 | 1/1983 | Hanley et al. | 250/492.2 |
| 4,380,703 | 4/1983 | Schmitt | 250/396 ML |
| 4,494,005 | 1/1985 | Shibata et al. | 250/492.2 |
| 4,544,847 | 10/1985 | Taylor | 250/396 ML |
| 4,661,712 | 4/1987 | Mobley | 250/492.2 |
| 4,687,936 | 8/1987 | McIntyre et al. | 250/397 |
| 4,745,281 | 5/1988 | Enge | 250/396 R |
| 4,922,106 | 5/1990 | Berrian et al. | 250/492.2 |
| 4,980,562 | 12/1990 | Berrian et al. | 250/492.2 |

FOREIGN PATENT DOCUMENTS

| | | | |
|---|---|---|---|
| 61-133545 | 6/1986 | Japan . | |
| 62-252047 | 11/1987 | Japan | 335/213 |

OTHER PUBLICATIONS

Winnard, IBM Technical Disclosure Bulletin, vol. 19, No. 9, Feb. 1977, pp. 3411-3412.
Allison, Jr. et al., "Design and Performance of a High Current 200 keV Electrostatically Scanned Ion Implantation Accelerator" in The Proceedings of the Symposium on Electron and Ion Beam Science and Tech., 7th Int'l Conference, 1976, pp. 482-489.
Dearnaley et al., Ion Implantation, North/Holland Publishing, Amsterdam, 1973, pp. 283-289, 387-409.

*Primary Examiner*—Jack I. Berman
*Attorney, Agent, or Firm*—Fish & Richardson

[57] ABSTRACT

System for irradiating the surface of a substrate with atomic or molecular ions by rapid scanning of a beam in two dimensions over the surface of the substrate. A scanning system is shown for deflecting the beam in two dimensions relative to a reference axis and a magnetic ion beam transport system following the scanning system is arranged to receive the beam from the scanning system over the range of two dimensional deflections of the scanning system and constructed to impose magnetic field conditions along the beam path of characteristics selected to reorient the two-dimensionally deflected beam to a direction having a predetermined desired relationship with the axis in the two dimensions at the desired instantaneous two dimensional displacement of the beam from the axis, to produce the desired scan of the beam over the substrate. One scanning system includes sequential first and second time-variable-field magnetic scanners, the first scanner having a magnetic gap of volume smaller than that of the second scanner and constructed to scan the beam more rapidly than the second scanner. In another system, the scanners are superposed. The magnetic ion beam transport system presently preferred is a system producing a sequence of three or more quadrupole fields, implemented by a sequence of quadrupoles. Alternate structures are disclosed. The system is capable of depositing atomic or molecular ions with a desired angular and positional uniformity over a wide range of perveance including perveance above $0.02/M[amu]^{\frac{1}{2}}$ (mA//keV$^{3/2}$) with a constant, adjustable spot size and small beam spread.

94 Claims, 16 Drawing Sheets

QUADRUPOLES ARE SHOWN
ROTATED 45° ABOUT Z-AXIS

|||| COILS WITH $\cos\theta_r$ TURNS DISTRIBUTION (PRODUCE $B_y$)
≡ COILS WITH $\sin\theta_r$ TURNS DISTRIBUTION (PRODUCE $B_x$)

RASTER

ROTATING RASTER R

LISSAJOUS

SYSTEM FOR IRRADIATING A SURFACE WITH ATOMIC AND MOLECULAR IONS USING TWO DIMENSIONAL MAGNETIC SCANNING

FIELD OF THE INVENTION

This invention relates to systems for utilizing ion beams such as in ion implanters.

BACKGROUND OF THE INVENTION

Modification of semiconductors such as silicon wafers is often implemented by ion implantation. Commonly, irradiation uniformity is achieved using time-varying electric fields in two dimensions to rapidly deflect the ion beam such that it scans in a raster pattern across the wafer surface. A pair of oppositely acting deflections for each dimension produces parallel scanning of the wafer. In this type of implanter the beam current and hence the rate at which wafers can be processed is severely limited by the space charge forces which are present in the region of the time-varying electric fields and which cause beam "blow-up".

In a common variation, a time-varying electric field is used to deflect the beam back and forth along one axis, while the wafer is mechanically reciprocated along an orthogonal axis. Again, in many cases, the beam current and wafer throughput is unduly limited by space charge forces. Furthermore, the mechanical motion of the wafer is relatively slow which limits wafer throughput when the total irradiation dose is low.

Time varying magnetic fields, which are used at high frequencies for electron scanning, have been suggested for scanning of beams of atomic and molecular ions. However, for the heavy ions frequently used in the processing of wafers, such as singly charged boron (B+), phosphorous (P+), arsenic (As+), and antimony (Sb+), the necessary scanner field energy is 10,000 to 100,000 times greater for magnetic deflection compared with electric deflection.

The techniques developed for rapid magnetic scanning of electrons which are less than 1/10,000 the mass of implantation ions, cannot be scaled to produce a structure suitable for an ion implanter. Hitherto, magnetic scanning techniques used in ion implanters have been limited to scan frequencies of just a few Hz, and again these structures are either not applicable or cannot be scaled to produce two dimensional raster scanning at rapid scan frequencies, i.e. above 100 Hz and up to 1,000 Hz and higher.

SUMMARY OF THE INVENTION

In one aspect, the present invention relates to a coordinated structure that produces a combination of time-varying magnetic fields followed by further magnetic fields, that are preferably static, which, by proper arrangement, enables heavy ion beams of high current to be scanned in two orthogonal directions at high scan frequencies, over a wide range of energies.

The invention provides the ability to construct an ion implantation machine that is operable over an extremely wide range of ions, at energies from e.g. 400 keV down to 5 keV and below with ion currents from 10 microamperes to 20 milliamperes and above.

In one important aspect, the invention features a two dimensional magnetic scanning system for a high perveance atomic or molecular ion beam, followed by a magnetic ion beam transport system that reorients the beam in two dimensions to the desired conditions for incidence upon the target.

Preferably, this aspect is implemented with a pair of axially separate magnetic deflectors, one for scanning in a first direction, for example the y-direction in the x-y plane defined by the wafer surface, and the other deflector following this y-scanner for scanning in the x-direction.

The scanner magnets, which are time-variable-field electromagnets, are arranged and configured in a manner to minimize the power required to deflect the beam in the two dimensions.

In preferred embodiments, to achieve high throughput of implanted targets, while minimizing the power requirements for operation of the two scanners, the y-scanner, having the smaller gap size and requiring less deflection, is operated at a fast scan frequency of the order of 1000 Hz or higher while the x-scanner, having the larger gap size and requiring a greater deflection angle is scanned at the slower scan frequency of the order of 50 Hz or higher.

Preferably, in various embodiments, the magnetic field, ion beam transport or translation system that follows the scanners produces a static field effective in both dimensions to achieve the desired relationships of the ion beam at the target. Preferably this system is a telecentric transport system (TTS) that produces a parallel beam at the wafer. The TTS system transforms the scanned beam into a telecentric beam, one where all the rays of the beam are substantially parallel, by imposing along the beam path, predetermined static magnetic fields.

The ion beam transport system following the x-scanner has a relatively large aperture for accommodating beam deflection imposed by both the scanners. Furthermore, it acts as an adjustable lens in which the focal length can be preselected to optimize the beam spot size and intrinsic deviations within the beam at the wafer. By proper setting of the parameters of the magnetic transport system, the beam spot size at the wafer may be made quite small for low beam currents, e.g. to minimize overscan and make efficient use of the beam, or the spot size may be made larger for high beam currents, since a narrow focal spot at high current densities could damage the wafer surface.

Preferably, in the scanner systems employing two separately spaced magnetic scanners, the ion beam transport system includes at least two ion optical transport elements. To define the telecentric beam the focal points of these combined elements are selected to be at the centers of the scanners.

Other aspects of the invention feature other embodiments of the scanner and of the magnetic ion beam transport system.

In another aspect the invention relates to a two dimensional magnetic scan system employing magnetic field detection elements associated with the scanning system and a closed loop control system based upon the detected field values for controlling the scanning system to produce a prescribed ion dose profile over the two dimensions.

A feature of the invention is a system for irradiating a surface of a substrate with atomic or molecular ions by rapid scanning of a beam in two dimensions over the substrate. The system includes an end station for presenting a substrate to the beam, an ion source and associated beam-forming devices for producing a beam of atomic or molecular ions, a magnetic scanning system for deflecting the beam in two dimensions relative to a reference axis. The scanning system employs, for each dimension of scan, a single scanning magnet means formed of a yoke and pole means of magnetic material and associated energizing coils. The system also includes a magnetic ion beam transport system following the scanning system. The transport system is arranged to receive the beam from the scanning system over the range of two dimensional deflections of the scanning system and constructed to impose magnetic field conditions along the beam path of characteristics selected to reorient the two-dimensionally deflected beam to a direction having a predetermined desired angular relationship with the axis in the two dimensions at the desired instantaneous two dimensional displacement of the beam from the axis, to produce the desired scan of the beam over the substrate.

In preferred embodiments: the magnetic scanning means, for at least one dimension of scan, is constructed to scan the beam over the surface of the substrate at a frequency greater than 100 Hz; the magnetic ion transport system has characteristics to reorient the two-dimensionally deflected beam in a dimensionally decoupled manner; and/or the scanning system includes a first time-variable-field magnetic scanner for scanning the beam in the first dimension, and located axially downstream therefrom, a second time-variable-field magnetic scanner magnetically uncoupled from the first scanner for scanning the beam in the second dimension. The scanners are effective at each instant to deflect the beam from the reference axis in a decoupled manner at respective angles in the respective dimensions that are determined by the desired instantaneous displacement of the beam on the substrate.

Another feature of the invention is a system for depositing atomic or molecular ions with a desired uniformity by rapid scanning of a beam over a wide range of perveance including perveance above $0.02/M[\text{amu}]^{\frac{1}{2}}$ ($\text{mA/keV}^{3/2}$) over the surface of a substrate. The system includes an end station supporting the substrate, an ion source for producing a beam of atomic or molecular ions, beam forming devices for producing a beam of atomic or molecular ions including a momentum analyzer for removing, from the beam, ions of unwanted mass or energy and an accelerator for establishing the desired final velocity of the ions. A magnetic scanning system is provided for deflecting the beam in two dimensions relative to a reference axis. The scanning system includes first and second time-variable-field magnetic scanners in first and second positions along the axis of the system for successively deflecting the beam in respective dimensions. The first scanner is constructed to rapidly scan the beam in the first dimension and has a magnetic gap through which the beam passes of volume smaller than the volume of the magnetic gap of the second scanner and is constructed to scan the beam more rapidly than the second scanner. The scanners are effective at each instant to deflect the beam from the reference axis in a decoupled manner at respective angles in the respective dimensions that are determined by the desired instantaneous displacement of the beam on the substrate. Each of the magnetic scanners are comprised of yoke and pole means of magnetic material and associated energizing coils, and each has a respective deflection circuit and power supply for applying time-varying current to the coil. A magnetic ion beam transport system follows the scanners. The transport system is arranged to receive the beam from the scanners over the range of two dimensional deflections of the scanners and is constructed to impose static magnetic field conditions along the beam path of characteristics selected to reorient the two-dimensionally deflected beam in a dimensionally decoupled manner, to a direction having a predetermined desired angular relationship with the axis in the two directions at the desired instantaneous two dimensional displacement of the beam from the axis, to produce the desired scan of a beam spot of finite ion-distributing size over the substrate. The magnetic ion beam transport system is constructed to provide at the substrate a beam of substantially constant beam size at the substrate in which directions of travel of the ions deviate by less than about 2° from a desired direction over the range of scan.

In various preferred embodiments of the system described above and hereinafter, the second scanner is located closely adjacent the first scanner without any beam-influencing optical element interposed therebetween; the first scanner is constructed to operate at a scanning frequency of the order of about ten times higher than, and not a rational multiple of, the scanning frequency of the second scanner, the system constructed to provide a ribbon-form ion beam to the scanning system, the shorter dimension of the cross section of the ribbon being aligned with the direction of the thickness of the gap of the first scanner; and/or the gap of the second scanner diverges in the axial direction in manner and direction corresponding to the divergence of the deflection envelope produced by the first scanner, while the width (direction perpendicular to the gap) of the poles of the second magnetic scanner correspondingly increases progressively in the axial direction.

In yet other various embodiments of the system the scanner coils and associated magnetic circuits are effective to generate fields to deflect the beam in decoupled manner in both dimensions are located in the same general vicinity along the beam path. Preferably, the system includes a circular iron yoke, a multiplicity of poles distributed about and extending inwardly toward the axis of the yoke, and respective, separate x and y dimension deflection coils associated with the poles. Preferably, the windings of the coils on the poles for the respective deflection directions vary in number according to the angular position of the poles relative to the respective deflection axis, and means are provided to connect the respective sets of coils in series to be driven by a single, respective energization current for deflection in the respective dimension.

In still other various embodiments of the system: the beam-forming devices form a conjugate ion optical image of the ion source and the scanner system is positioned in the region of the image to keep relatively small the magnetic gaps of the scanning system. The poles and yoke structure of the magnetic scanning system are comprised of insulated laminations of magnetic material of thickness less than 1 mm. Preferably, the thickness of the laminations is of the order of 0.5 mm. The ion beam transport system is an electromagnet system for establishing static magnetic fields capable of effecting a linear transformation of the two-dimensionally deflected beam such that the final position and angle at which the beam impinges on the target is a linear function of the angular direction and displacement of the beam entering the ion beam transport system. Preferably the magnetic ion beam transport system is constructed to impose static magnetic field conditions along the beam path sufficient to produce a beam of ions such that the angular direction of each ion deviates by less than about 2° from the desired direction over the range of scan. Preferably, the magnetic ion transport system has adjustable parameters for adjusting the angle of the beam upon the substrate over a range of diverging, parallel and converging values. Preferably the magnetic ion beam transport system imposes static magnetic field conditions to produce a beam that is parallel with the reference axis in the two dimensions. Preferably, the magnetic ion beam transport system is constructed to impose static magnetic field conditions along the beam path to produce a beam that has a substantially constant ion-distributing spot size at the substrate over the range of scan. Preferably the magnetic ion transport system has adjustable parameters for adjusting the size of the beam at the substrate.

In yet other various embodiments of the system: the ion beam transport system includes multiple, axially spaced-apart static magnetic field-imposing elements constructed to enable accommodation of the different axial positions of the scanners while producing linear transformation of the deflected beam to the desired angular relationship and displacement of the beam. Preferably the magnetic ion beam transport system includes means to apply at least one static quadrupole field followed by second magnetic means applying static magnetic fields effective in the two dimensions of deflection. Preferably, the magnetic ion beam transport system includes means to apply, in sequence, at least three quadrupole fields of alternating polarity. Preferably the magnetic ion beam transport system includes at least three quadrupole magnets in sequence. Preferably the magnetic ion beam transport system includes a bending magnet having at least three differing sections along its length constructed to produce respective quadrupole fields of alternating polarity. Preferably, the x and y dimension object points of the quadrupole field system occur respectively at the x and y dimension magnetic scanners in the manner to satisfy telecentric conditions. Preferably the ion beam transport system has quadrupoles located substantially as set forth in Table I, appendix to the specification. Preferably the parameters of the quadrupole fields are adjustable to change the ion-distributing spot size of the beam spot size at the substrate which then remains substantially constant over the scan. Preferably the parameters of the quadrupole system are adjustable to vary the beam angle at the substrate over a range of convergent, parallel and divergent relationships, with the selected relationship being maintained over the scan. Preferably the second magnetic means includes a solenoid means. Preferably the solenoid means includes adjacent solenoids of opposite polarity.

In other various embodiments, the ion beam transport system includes a solenoid system. Preferably the solenoid system has multiple solenoids, the currents in the solenoids being controlled to control beam rotation. Preferably the system further includes means to adjust currents of the solenoids relative to each other to provide a desired, controlled amount of rotation. Preferably the solenoid system includes a pair of solenoids having opposite current flows, whereby the second solenoid compensates for rotation of the beam by the first solenoid. Preferably the magnitudes of currents in the solenoids are equalized to prevent rotation of the beam. Preferably the scanning system includes first and second scanners that are located at different axial positions and the ion beam transport system further includes a magnetic device to superimpose the virtual objects of the x and y dimension rays presented to the solenoid system. Preferably the scanners for the first and second dimensions are substantially superimposed and the ion beam transport system includes solely solenoid means.

In other various embodiments: the magnetic ion beam transport system for imposing magnetic fields includes a bending magnet followed by a quadrupole. The magnetic ion beam transport system for imposing magnetic fields includes a bending magnet followed by at least one solenoid. The scanning system further includes a power amplifier constructed to excite magnetic coils of the scanning system with desired substantially triangular current excitation waveforms. Preferably the power amplifier is constructed to produce a square voltage waveform that results in a substantially linear change of current applied to the scanning system over about 80% of half of a scan cycle.

In still other various embodiments: the scanning system is constructed to deflect the beam in one dimension at a scan frequency of the order of 1000 Hz or higher and in the other dimension at a scan frequency of the order of 50 Hz or higher.

The system is constructed to enable scanning of beams over a wide range of perveance including perveances both substantially above and substantially below $0.02/M[amu]^{\frac{1}{2}}$ ($mA/keV^{3/2}$). Preferably the system enables scanning of beams having high beam currents such as an arsenic beam of about 20 mA at low energies from 100 keV down to about 5 keV. Preferably the system enables scanning of beams having high beam currents in the range of 10 to 20 mA at high energies of the order of 100 to 400 keV. Preferably the system operates as an ion implanter for implantation of ions in a wafer including ions of boron, phosphorous, arsenic and antimony. Preferably the system scans over an area having up to a 12 inch diameter. Preferably the system produces a beam diameter of about 10 to 80 mm at the substrate. Preferably the system is constructed to complete multiple scans over a wafer up to 12 inches diameter such that an irradiation uniformity of better than 0.5% over the entire wafer is achieved in less than 10 seconds.

In still other various embodiments: the system includes power amplifier means for driving a magnetic scanner of the scanning system, the power amplifier means producing a characteristic voltage ripple, the scan frequency of the scanner selected not to be a rational multiple of the characteristic voltage ripple. The ion beam transport system includes a scanner system constructed to produce a raster scan. The magnetic ion beam transport system includes a scanner system constructed to produce a rotating raster scan. The ion beam transport system includes a scanner system constructed to produce a Lissajous motion.

In other embodiments, the system includes a dynamic feedback control system. The feedback control system includes magnetic field detection means for detecting the magnetic fields of the scanning system and producing signals indicative of the fields affecting the beam during scanning of the ion beam; and feedback control system for controlling the scanning system to produce a prescribed magnetic field profile in each of the two dimensions in a closed loop manner in response to the field detection means.

In various embodiments the system includes a dynamic feedback control system including ion dose detection means for detecting the dose at the target of the scanning system and producing signals indicative of the dose during scanning of the ion beam; and feedback control system for controlling the scanning system to produce a prescribed ion dose in the two dimensions in a closed loop manner in response to the dose detection means.

Another feature of the invention is a system for irradiating a surface of a substrate with atomic or molecular ions with a desired uniformity over the substrate, constructed to enable rapid scanning of beams over a wide range of perveance including perveance above $0.02/M[amu]^{\frac{1}{2}}$ (mA/keV$^{3/2}$). The system includes an end station for presenting a substrate to the beam, an ion source and associated beam-forming devices for producing a beam of atomic or molecular ions, a magnetic scanning system capable of scanning the beam in two dimensions over the surface of the substrate, the system employing, for each dimension of scan, a single scanning magnet means formed of yoke and pole means of magnetic material and associated energizing coils; means for providing signals representing the desired position of the beam to produce a prescribed ion dose profile; and a dynamic closed loop feedback control system. The feedback system includes magnetic field detection means for detecting the magnetic fields of the scanning system and producing signals indicative of the fields affecting the beam during scanning of the beam, and feedback control system for controlling the scanning system to produce the prescribed magnetic field profile in the two dimensions in a closed loop manner in response to the field detection means.

Another feature of the invention is a system for irradiating a surface of a substrate with atomic or molecular ions with a desired uniformity over the substrate, constructed to enable rapid scanning of beams over a wide range of perveance including perveance above $0.02/M[amu]^{\frac{1}{2}}$ (mA/keV$^{3/2}$). The system includes an end station for presenting a substrate to the beam, an ion source and associated beam-forming devices for producing a beam of atomic or molecular ions, a magnetic scanning system capable of scanning the beam in two dimensions over the surface of the substrate, the system employing, for each dimension of scan, a single scanning magnet means formed of yoke and pole means of magnetic material and associated energizing coils; means for providing signals representing the desired position of the beam to produce a prescribed ion dose profile; and a dynamic closed loop feedback control system. The feedback system includes ion dose detection means for detecting the dose at the target of the scanning system and producing signals indicative of the dose during scanning of the beam, and feedback control system for controlling the scanning system to produce the prescribed ion dose in the two dimensions in a closed loop manner in response to the dose detection means.

In preferred embodiments, the field detection means comprise inductive coils inside the magnetic scanning system, and/or the control system includes means to perform analysis of signals from the magnetic field detection means into Fourier components and/or phase power series analysis.

Another feature of the invention is a magnetic scanning system constructed to deflect a beam of atomic or molecular ions in a first and second dimension relative to a reference axis, the system has a first and second time-variable-field magnetic scanners in first and second positions along the axis of the system for successively deflecting the beam in the respective dimensions. Each magnetic scanner comprises a yoke and pole means of magnetic material and associated energizing coils, and each has a respective deflection circuit and power supply for applying time-varying current to the coils. The first time-variable-field magnetic scanner has a magnetic gap through which the beam passes of volume smaller than the volume of the magnetic gap of the second scanner and is constructed to scan the beam in its respective dimension more rapidly than does the second scanner whereby the power requirement imposed by the higher frequency for the first scanner is ameliorated by the lower gap volume of the scanner. The scanners are effective at each instant to deflect the ion beam from the reference axis in a decoupled manner at respective angles in the respective dimensions that are determined by the desired instantaneous displacement of the ion beam.

Another feature of the invention is a magnetic scanning system for deflecting a beam of atomic or molecular ions in a first and second dimension relative to a reference axis. The system employs respective first and second time-variable-field magnetic scanning magnet means formed of a yoke and pole means of magnetic material and associated energizing coils. Each has a respective deflection circuit and power supply for applying time varying current to the coils. The scanner coils and associated magnetic circuits are effective to generate fields to deflect the beam in decoupled manner in both dimensions and are located in the same general vicinity along the beam path.

In preferred embodiments, the system includes an ion beam transport system following the scanning system, arranged to receive the beam from the scanning system over the range of two dimensional deflections of the scanning system and constructed to impose conditions along the beam path of characteristics selected to reorient the two-dimensionally deflected beam to a direction having a predetermined desired angular relationship with the axis in the two dimensions at the desired instantaneous two dimensional displacement of the beam from the axis, to produce the desired scan of the beam.

Another feature of the invention is a system for scanning of a beam of atomic or molecular ions in two dimensions. The system includes a scanning system for deflecting the ion beam in two dimensions relative to a reference axis, and a magnetic ion beam transport system following the scanning system, having multiple, axially spaced-apart static magnetic field-imposing elements constructed to impose static magnetic field conditions along the beam path of characteristics selected to reorient the two-dimensionally deflected ion beam to a direction having a predetermined desired angular relationship with the axis in the two directions at the desired instantaneous two dimensional displacement of the ion beam from the axis, to produce the desired scan of an ion beam spot of finite ion-distributing size. In preferred embodiments, the scanned beam is scanned by a system comprising first and second scanners that are located at different axial positions and the transport system is constructed such that its focal planes in the respective dimensions accommodate to the difference in center location of the first and second scanners.

It will be understood that the various features of the invention as discussed above, may include the additional features of the preferred and various embodiments, as discussed above.

BRIEF DESCRIPTION OF DRAWINGS

FIG. 1a is a diagrammatic representation, in top view, of an ion implantation system employing two dimensional magnetic scanning of the ion beam followed by a set of three quadrupoles while FIG. 1b is a partial representation, in side view, of the quadrupole section of FIG. 1a;

FIG. 3a is an end view of the specially contoured poles of the second scanner magnet of the system of FIGS. 1, while FIG. 3b is a cross-section thereof taken on line 3b . . . 3b of FIG. 3a;

FIG. 4a is a diagrammatic cross-section of the preferred laminated structure of the scanner magnets while

FIG. 6a is a cross-sectional view of the quadrupole employed in the system of FIG. 1a, while FIG. 6b is a side view of the quadrupole;

FIGS. 8a and 8b are, respectively, projections on the z-x and y-z planes of principal rays at different times deflected by spaced apart y- and x-scanners and subject to the magnetic fields of the three quadrupoles shown in FIG. 1a;

FIG. 11 is a schematic diagram of the electronic control circuit used to excite and control the oscillating magnetic field in a scanner magnet of FIG. 1a;

FIG. 13 is a cross-sectional view of a solenoid useful as the magnetic ion transport system with the scanning system of FIG. 12a;

FIG. 16 is a plot of perveance vs. mass that illustrates the capability of systems according to the present invention to employ high perveance atomic and molecular ion beams for achieving uniform dose rates at high beam current and low beam energy and the like; and FIG. 17a shows the use of an array of sets of apertures arranged near the corners of the scan domain and after the last quadrupole, each set of apertures arranged in pairs such that a typical axis through each pair is in an prescribed direction, while

DESCRIPTION OF PREFERRED EMBODIMENT

Figure 1A:
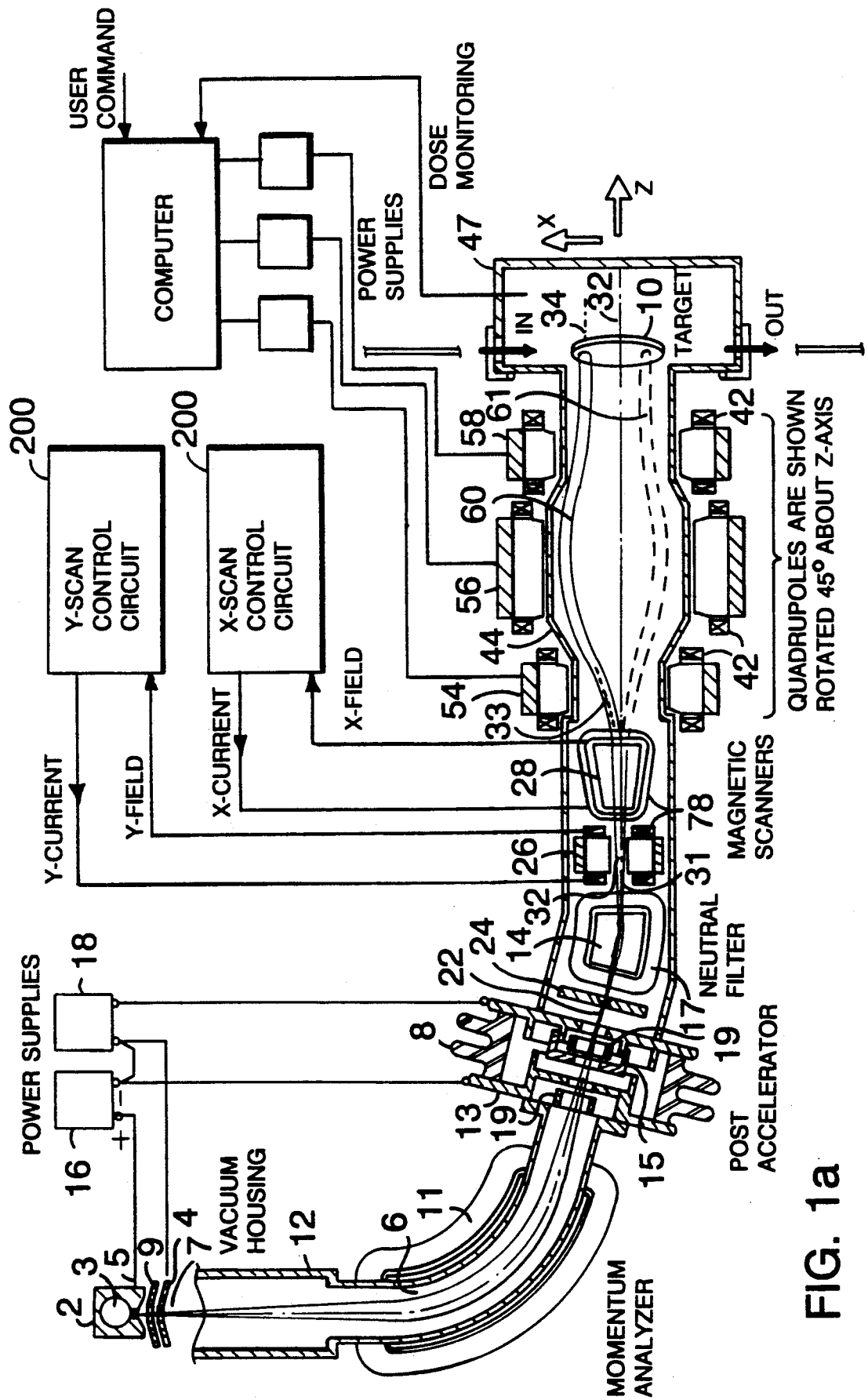
Figure 1B:
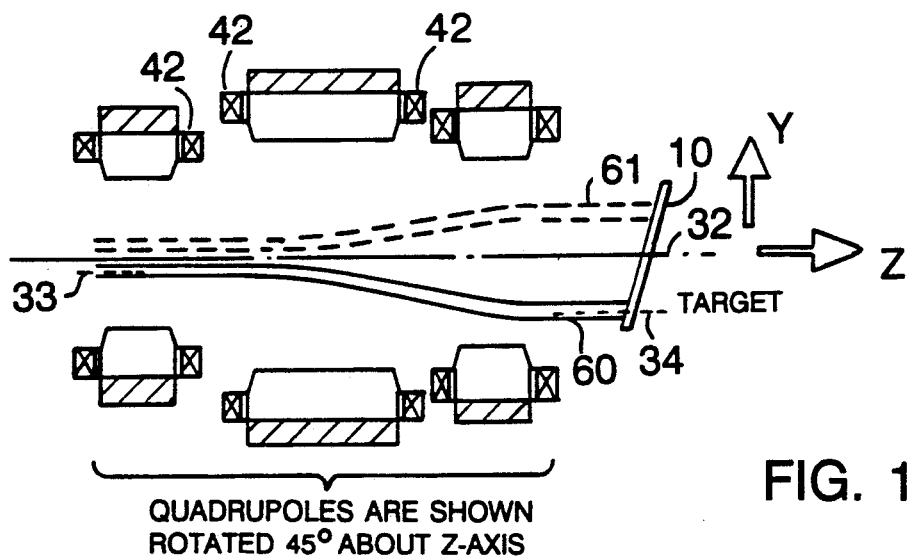

With reference to FIGS. 1a and 1b there is shown a diagrammatic representation of the elements of a two dimensional ion beam scanning system, according to the invention and using two, orthogonal, time-varying magnetic deflections of ions produced respectively in a y-scanner magnet 26, an x-scanner magnet 28, and a sequence of three coaxial magnetic quadrupoles 54, 56, and 58. Oscillatory magnetic fields oriented in the x and y directions and acting on the ions are respectively generated by the y-scanner magnet 26 at a frequency typically of 1000 Hz, and by the x-scanner magnet 28 at a frequency typically of 100 Hz. Positive ions travelling in paths more or less along the z-axis 32 in the form of a beam 31, of restricted x and y dimensions, enter the scanning system and are caused to undergo, at corresponding frequencies, oscillatory angular deflections first in the y-z plane by the y-scanner magnet 26, and then in the x-z plane by the x-scanner magnet 28. At an instant in time, ions that have just emerged from the x-scanner magnet 28 remain in the form of a beam but now the longitudinal axis 33 of the beam is oriented at an angle to the z-axis 32 as a result of the angular deflections imparted to the ions by the y- and x-scanner magnets. On reaching the first quadrupole magnet 54, the center of the ion beam is displaced from the z-axis 32 by a distance in the x-direction proportional to the angular deflection received on passing through the x-scanner magnet 28, and by a distance in the y-direction proportional to the angular deflection received on passing through the y-scanner magnet 26. The three quadrupole magnets 54 56 and 58 each have static magnetic fields causing further reorientation and position displacement of the ion beam with respect to the z-axis 32. In one important feature of this preferred embodiment, the magnetic fields in the three quadrupoles 54, 56 and 58 are coordinated to reorient the deflected ion beam such that its longitudinal axis 34 at a target 10 is parallel to the z-axis 32, irrespective of the position of the beam in the x-y plane (i.e., the ion beam is telecentric). However, the position of the ion beam at the target 10 is rapidly varying in the x and y directions at the respective frequencies of the x and y scanners; the instantaneous x and y positions of the ion beam are respectively proportional to the angular deflections imparted to the ions by the x- and y-scanner magnets 28 and 26; and the beam size is nearly constant irrespective of beam position. This two dimensional parallel scanning technique is shown by the beam envelope 60 drawn as solid lines in FIGS. 1a and 1b and representing the envelope traced out by ions entering the scanning system at one instant of time, and the envelope 61 that occurs for ions entering at another instant of time.

Yet another important feature of the preferred embodiment is that all of the scanner elements have fields which are only magnetic in nature. In such absence of electric fields, residual electrons are held within the beam envelope. The ion beam remains electrically neutral, repelling space charge forces are absent, and the parallel scanning technique thus described remains effective without limit as the intensity of the ion beam is increased.

Figure 16:
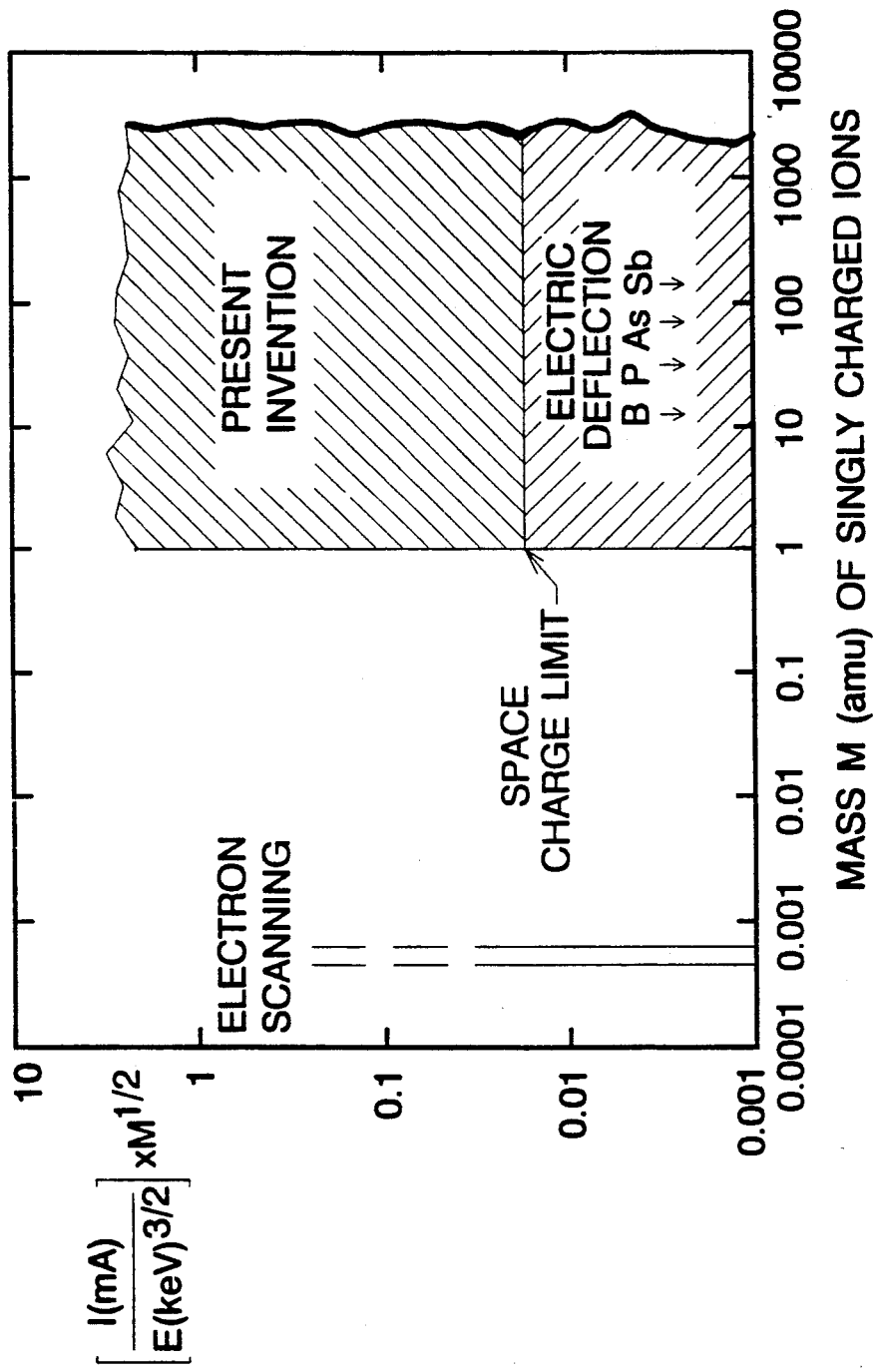

Hitherto, it has not been possible to rapidly scan (up to 1 kHz or more) heavy ion beams (M=1 to 1000 atomic mass units) with a perveance, $I/E^{3/2}$ (I=beam current—mA; E=ion energy—keV) greater than about $0.02/M^{\frac{1}{2}}$. In this regard the great utility of the present invention, compared with the operating regime that has been realized with existing electrical deflection techniques, is illustrated in FIG. 16.

One example of the usefulness of the present invention is the need in semiconductor ion implantation to uniformly and rapidly irradiate a target area 10 (FIG. 1a), which is more or less equally large in the x and y directions and fixed in position relative to the z-axis 32, with beams of ions such as boron (M=11), phosphorous (M=31), arsenic (M=75) and antimony (M=121, 123), at energies from 400 keV down to as low as 5 keV and beam currents up to and in excess of 20 mA.

FIGS. 1a and 1b further show the preferred embodiment of an ion implanter in which positively charged ions of a more or less selected species such as boron, phosphorus, arsenic or antimony, are generated in the plasma chamber 3 of ion source 2 and emerge from an orifice 5 (or array of orifices) usually of rectangular or circular geometry. The ions are extracted by an extraction electrode 4, with orifice(s) 7 aligned and corresponding to the orifices 5 of the plasma chamber 3, which is held at an electrical potential typically 5 to 80 kV more negative than that of the plasma chamber by means of a power supply 16. The geometrical shape and position of the extraction electrode 4 in relation to the plasma chamber orifice 5 is chosen such that a well-defined beam emerges from the extraction electrode 4 in which the angular spread of the ion trajectories is typically less than 2°. The ions are purified according to their charge (Q) to mass (M) ratio Q/M, by an analyzer magnet 6 coordinated with a cooled resolving slit 24 and a neutral filter magnet 14.

This preferred embodiment produces a ribbon-shaped beam having its narrow dimension lying in the direction of the gap of the first scanner, thus enabling the aforesaid gap to be minimized.

A suppressor electrode 9, located between the plasma chamber orifice 5 and the extraction electrode 4, is held at a more negative potential than the extraction electrode 4, thus inhibiting backstreaming electrons from reaching and damaging the ion source plasma chamber 3. The suppressor electrode 9 also prevents electrons from being drained out of the ion beam as the ion beam passes to the momentum analyzer 6. Low energy electrons contained within the ion beam envelope help to reduce the magnitude of the repelling forces (space charge forces) generated by electrical interaction between the ions of the beam.

A second stage of acceleration occurs in the post-accelerator 8 comprising two or more electrodes held at different electrical potentials by a power supply 18. The first electrode 13 is at the same electrical potential as the extraction electrode 4. The ions in the beam are accelerated when the last electrode 15 is at a more negative potential (typically 0 to −400 kV) than the first electrode 13. Also to achieve a very low final ion energy the polarity of the power supply 18 can be reversed in which case acceleration of a negative value (deceleration) occurs in the post-accelerator structure 8. The post-accelerator 8 is fitted with electron suppressor electrodes 19 at each end to prevent acceleration of electrons in the opposite direction of the ions and subsequent unnecessary current loading of the power supply 18. In addition, electrons are not drained from the beam envelope in the regions on either side of the post-accelerator 8, thereby reducing the diverging effects of space charge forces within the ion beam. Ions emerge from the post-accelerator 8 with energy selectable in the range of 5 to 400 keV per ion charge state as a result of the combined output voltages of the power supplies 16 and 18.

The momentum analyzer 6 is positioned before the post-accelerator 8 thus enabling it to operate at a lower magnetic energy. Secondly, in this position, unwanted ion species from the ion source are prevented from entering the post-accelerator 8, thereby minimizing the electrical current and power requirements of power supply 18. The neutral particle filter 14, following the post-accelerator 8, is a bending magnet which separates the ion beam from neutral particles formed in either the momentum analyzer 6 or the post-accelerator 8. Neutral species, passing undeflected through the neutral filter 14, are separated from the ion beam. Thus, a beam of nearly pure ionic species enters the scanner magnets. The cooled resolving slit 24 is located at a point 22 which is the ion optical conjugate image of the dimensions of the extraction electrode orifice 7 in the median plane (z-x plane) of the momentum analyzer 6. The location of the conjugate image point 22 is dependent upon the ion-optical properties of the momentum analyzer 6 and the post-accelerator 8 and is chosen to make the x-dimension of the conjugate image 22 of the order of a few millimeters (mm). In this way the width of the cooled resolving slit 24 is correspondingly small, so that unwanted ion species and many neutral particles are intercepted by the body of the cooled resolving slit 24 structure. From the source 2 to the target 10 the beam is transported in a vacuum housing 12 and 44. The target is contained in an end station 47, also under vacuum. Typically, a vacuum interlock structure and appropriate wafer feed mechanisms, not shown, are employed to enable serial processing and wafer handling according to known techniques.

In another aspect of the preferred embodiment shown in FIGS. 1a and 1b, all of the magnetic elements—the analyzer magnet 6, the neutral filter 14, the y and x scanners 26 and 28, the three quadrupoles 54, 56 and 58—are electromagnets in which the magnitude of their magnetic fields can be adjusted in coordination, by adjusting the electrical currents in their excitation coils 11, 17, 78 and 42. According to the Lorentz force [REF 1] the deflection angle in radians produced by a magnetic element is equal to the integrated magnetic field strength along the ion path divided by the magnetic rigidity K of the ion, where:

$$K = (2ME/Q^2)^{\frac{1}{2}} \quad (1)$$

and M, E and Q are the ion mass, energy and charge respectively. By adjusting the coil current of each magnetic element in proportion to the magnetic rigidity K of the ion, a prescribed geometrical deflection of the ion occurs, irrespective of the particular ion species and energy. The usefulness of this feature is the ability to use a given two dimensional parallel scanning system in ion implantation over a wide range of selected particle species and energies.

Figure 2:
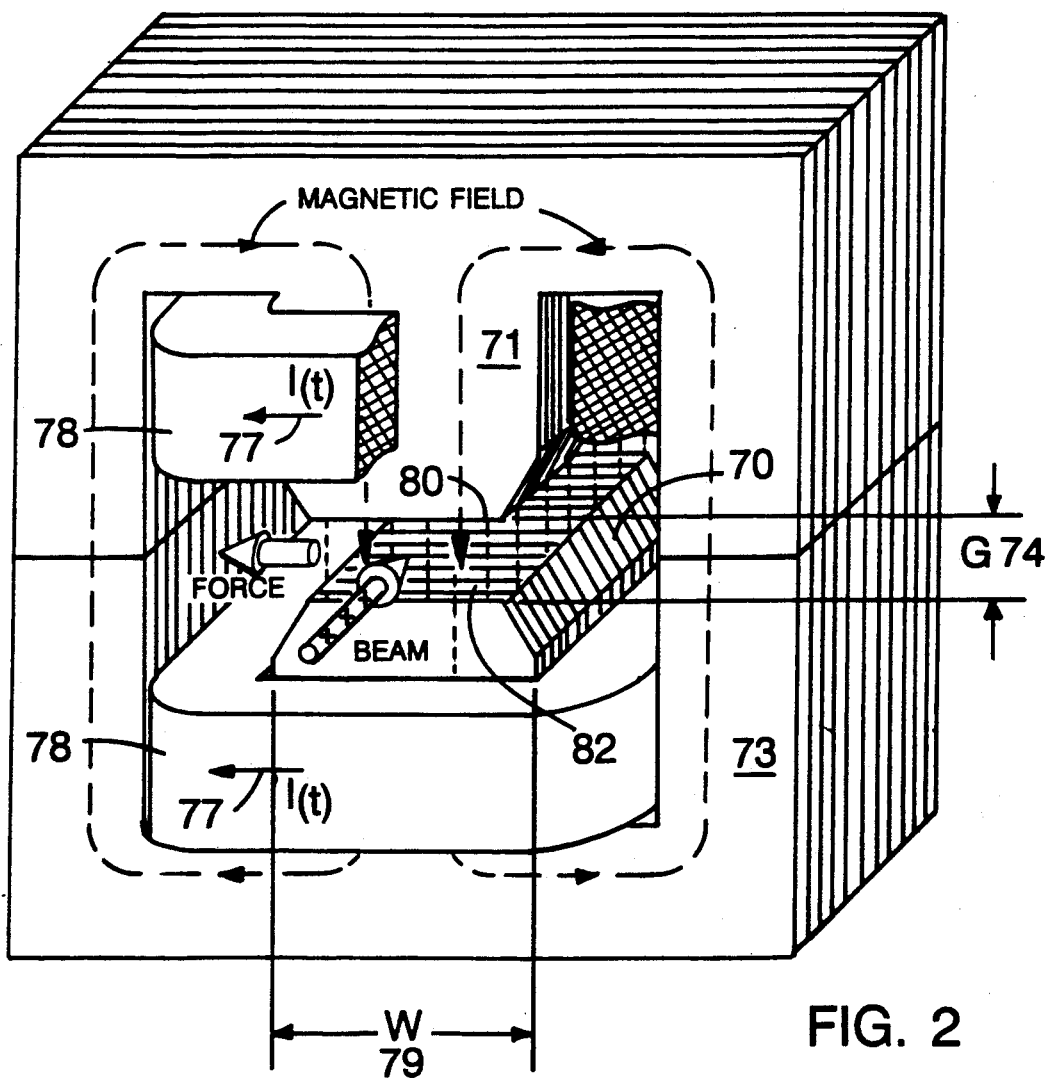
FIG. 2 is a diagrammatic perspective view of a laminated scanner magnet used in the system of FIGS. 1.

Referring to FIG. 2 there is shown the structure of a scanner magnet in the preferred embodiment wherein the oscillatory magnetic field 80 is generated in a magnetic circuit excited by an oscillatory current 77 passing through the turns of a pair of coils 78, each surrounding a pole 71 constructed of high permeability, thin ferromagnetic laminations 70 and magnetically connected to each other by a yoke 73, also of high permeability, thin ferromagnetic laminations. The facing surfaces 82 of the two poles 71 are separated by a gap 74 through which the ion beam passes. Within the gap a force acts on the ions in a direction perpendicular to both the direction of the magnetic field and the direction of the velocity vector of the ion. A suitably well defined magnetic field B is generated in the pole gap by making the dimension W of the pole width 79 approximately 3 times as large as the dimension G of the pole gap 74:

$$W \approx 3G \quad (2)$$

An important feature of the scanner magnet in the preferred embodiment is the high magnetic permeability pole 71 and yoke 73 structure which concentrates the magnetic energy almost entirely in the region of the pole gap 74, thereby minimizing the excitation power. For such a structure the excitation power P required to generate a sinusoidal oscillatory angular deflection of amplitude α, on ions with a magnetic rigidity K, at a frequency f is, in MKS units:

$$P = 7.5 \times 10^6 \, K^2 \alpha^2 f G^2 / L \quad (3)$$

where L is the effective length of the scanner field (approximately 150 mm for the first scanner 26 and 300 to 400 mm for the second scanner 28). This last result immediately shows the advantage of a small gap dimension G.

Another important aspect of the preferred embodiment is the relative order and physical location of the scanner magnets. Referring to FIGS. 1a and 1b, the higher frequency y-scanner magnet 26 is located immediately after the cooled resolving slit 24, near the conjugate focus of the momentum analyzer 6 and accelerator 8. Here the x dimension of the preferred ribbon-shaped beam is small. Accordingly, the gap of the y-scanner, which is in the x-direction, is correspondingly small (approximately 10 mm). The x-scanner 28 is located immediately after the y-scanner because its gap, which is in the y-direction, must be substantially larger (approximately 50 mm) in order to accommodate the range of oscillatory deflections produced by the y-scanner. However, the required excitation power is similar since the x-scanner 28 operates at a lower frequency. By comparison, locating the high frequency scanner in the second rather than the first position, would increase the total operating power for the two scanners by approximately an order of magnitude.

Figure 3A:
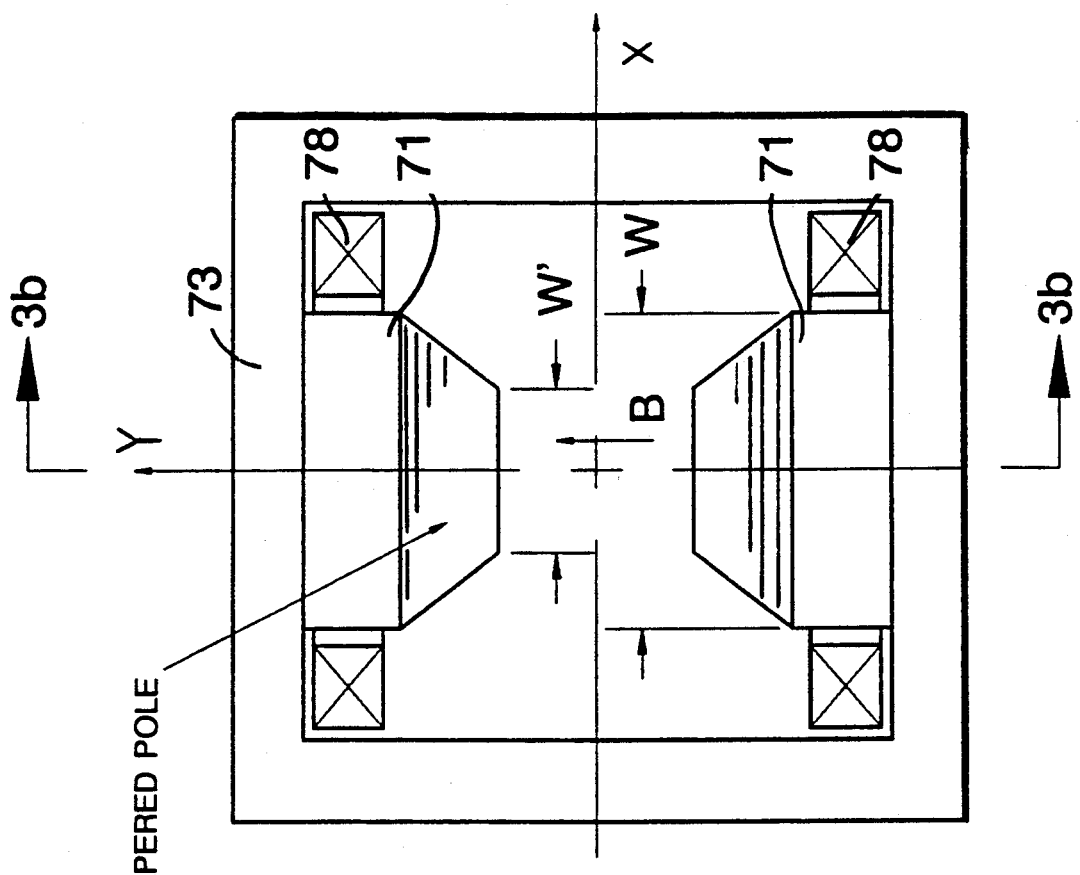
Figure 3B:
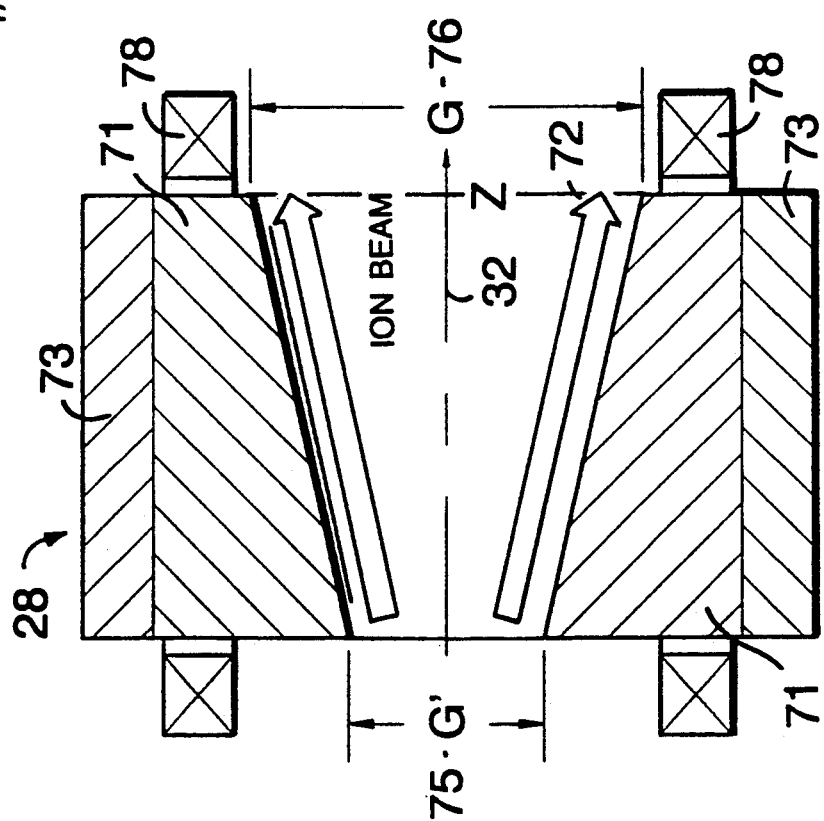

In yet another important aspect of the preferred embodiment, the operating power of the second scanner 28 is reduced by contouring the pole as shown in FIGS. 3. The pole gap is smaller at the entrance 75 than at the exit 76, to the extent that the range of oscillatory deflection of the beam 72 produced by the first scanner increases from the entrance to exit of the second scanner. Moreover, the pole width W' at the entrance is less than at the exit (W) in accord with eq. (2), see FIG. 3a. In a preferred embodiment the pole gap increases linearly with distance along the z-axis 32 from G' at the entrance to G at the exit. In addition, the pole width also increases linearly with distance along the z-axis 32 in accordance with eq. (2). For such a pole profile the operating power is given by $$P' = P\{(1-\beta)/\log_e \beta\}^2 \quad (4)$$

where $\beta = G'/G$ and P is the operating power having the same length, producing the same deflection, but possessing a uniform gap equal to the exit pole gap. In the preferred embodiment $\beta = 0.5$ in which case $P' = 0.52P$. In other words, contouring the pole in the second scanner magnet reduces its operating power by almost a factor of 2 compared with an uncontoured, constant gap scanner magnet that performs an equivalent function.

Figure 4A:
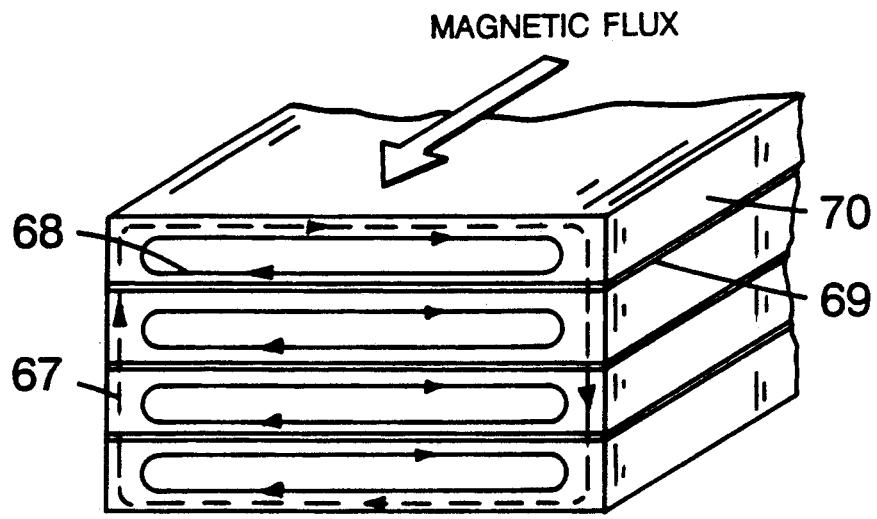
Figure 4B:
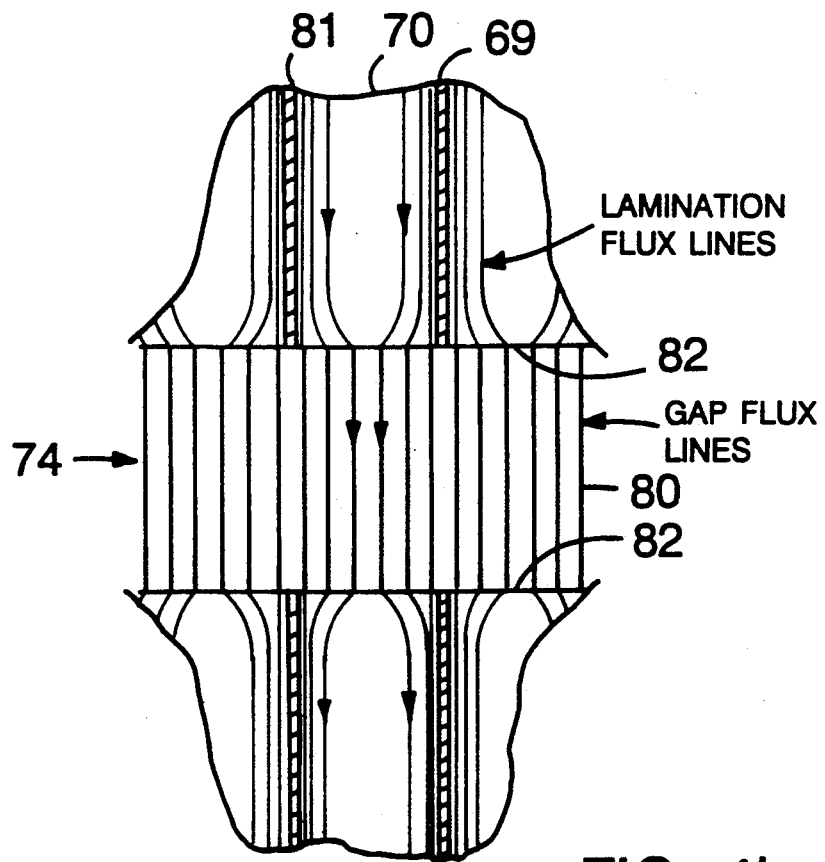
FIG. 4b illustrates the concentration of magnetic flux in the surface regions of the laminations.

FIGS. 4a and 4b further illustrate the preferred structure of the laminated magnets wherein the laminations 70 are electrically insulated from each other by a layer of an insulating material 69. Eddy currents 68 generated from the time-varying magnetic field within the laminations 70 thus flow within the boundaries of each lamination and are prevented from passing around the perimeter 67 of the pole and yoke. The eddy currents are in opposition to the coil current and cause the magnetic flux to be concentrated in the surface regions of the laminations as shown in FIG. 4b. The magnetic field diminishes approximately exponentially with distance from the surface. At a depth δ called the skin depth the field is 1/e (e≈2.7183) of its magnitude at the surface. Because the magnetic flux must be continuous across the pole face surface 82, the field B in the gap 74 is always less than the field $B_s$ at the lamination surface 81, according to the expression:

$$B/B_s \approx (\delta/d) \cdot \{2[\cosh(d/\delta) - \cos(d/\delta)]/[\cosh(d/\delta) + \cos(d/\delta)]\}^{\frac{1}{2}}$$

where d is the lamination thickness, $\delta = 1/(\pi\mu\sigma f)^{\frac{1}{2}}$, μ is the permeability of the lamination material, σ is its electrical conductivity, and f is the sinusoidal frequency of the field B, with MKS units throughout.

Figure 5A:
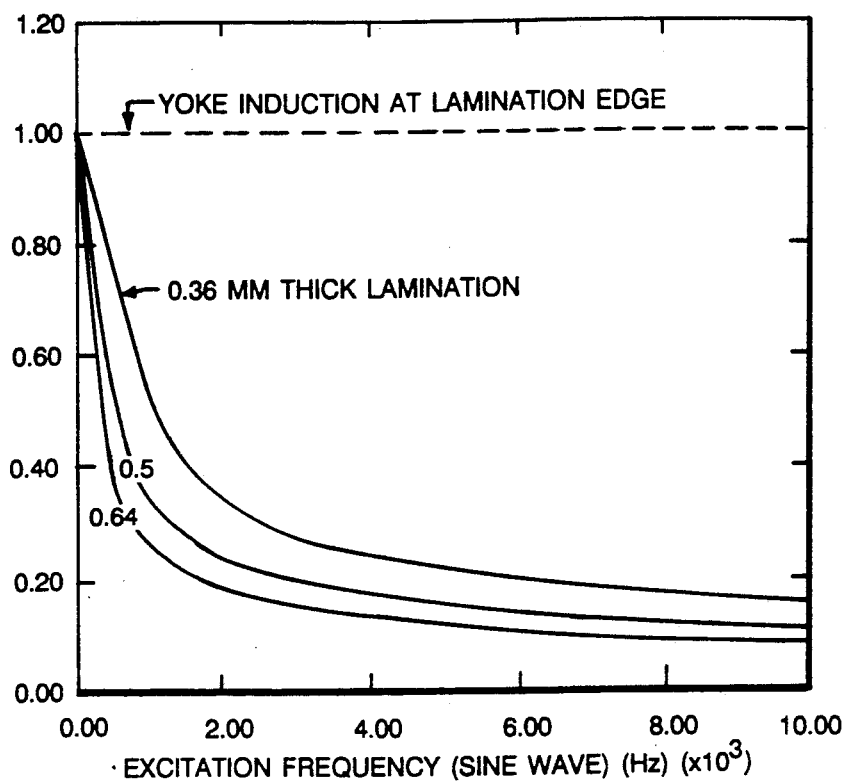
FIG. 5a is a graph illustrating that by use of thin laminations in the scanner magnets, significant gap fields (greater than 0.1 Tesla) are realizable at frequencies up to 10 kHz.
Figure 5B:
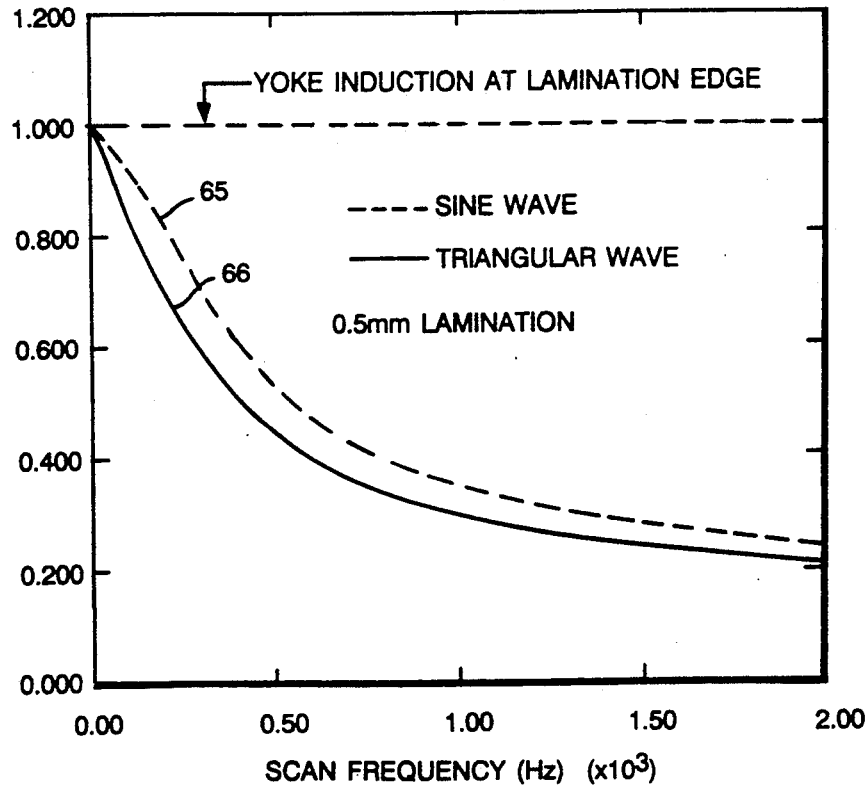
FIG. 5b is a graph showing that the amplitude of a triangular oscillatory field produced by the laminated magnets is only slightly less than that of a sine wave of the same frequency.
Figure 5C:
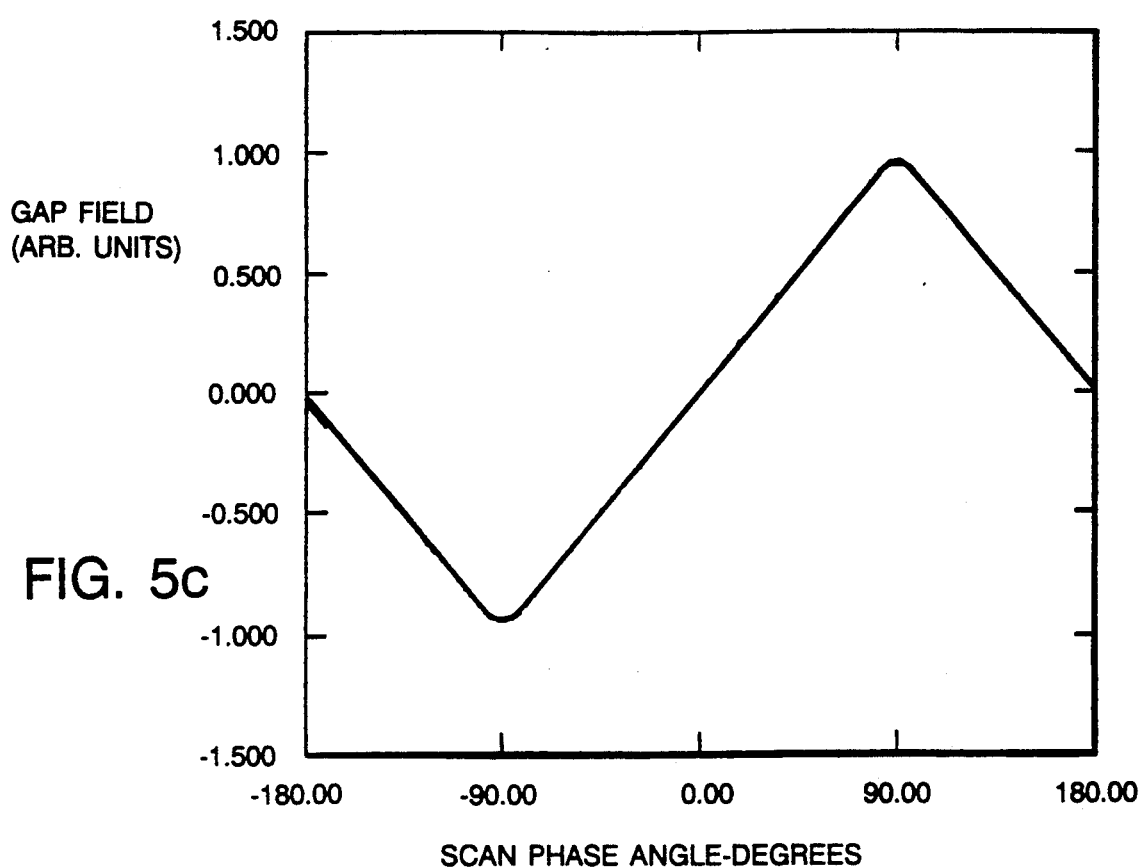
FIG. 5c is a graph showing a triangular oscillatory magnetic field waveform representing the addition of odd order harmonics to a fundamental frequency.
Figure 5D:
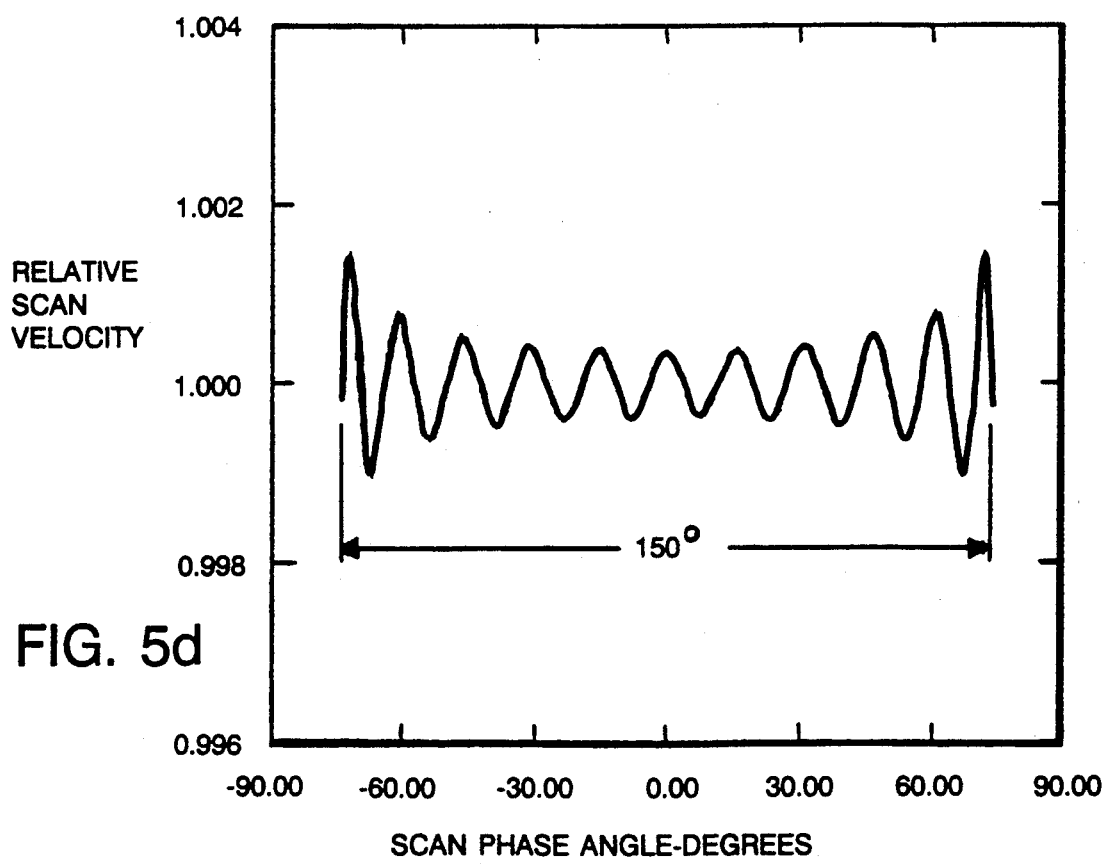
FIG. 5d shows that scan velocity achieved with the laminated scanning magnets can be constant to better than 0.2% over more than 80% of the scan.

FIG. 5a shows a further important aspect of the invention wherein gap fields greater than 0.1 Tesla at frequencies up to 10 kHz can be realized when the lamination thickness d is made sufficiently small, i.e. less than 1 mm, preferably of the order of 0.5 mm or smaller. The curves in FIG. 5a apply to values of d=0.36, 0.50 and 0.64 mm, $\sigma = 2.5 \times 10^6$ S/m and $\mu = 7000 \, \mu_o$ where $\mu_o = 4\pi \times 10^{-7}$ is the magnetic permeability of free space. Even though the induction $B_s$ in the yoke lamination is limited to 1 Tesla in order to avoid yoke saturation, significant gap fields still occur at high frequencies and this enables the generation of oscillatory fields up to 2 kHz with a waveform composed of higher order harmonics as well as the fundamental frequency. In accordance with the Fourier Transform theory, adding higher harmonic components to the fundamental sinusoidal frequency enables any continuous repetitive waveform to be generated. For example, adding small amounts of the odd order harmonics to the fundamental frequency produces an oscillatory magnetic field having a triangular waveform as shown in FIG. 5c. Such a waveform is advantageous, for example, in semiconductor ion implantation because it causes the beam to scan back and forth at constant velocity, thus uniformly irradiating the target 10. FIG. 5b shows that, for a limiting yoke field $B_s$ of 1 Tesla and 0.5 mm thick laminations, the amplitude 66 of a triangular wave oscillatory field, as a function of the fundamental frequency, is only slightly less than that of a sine wave field 65 of the same frequency. Indeed, for scan frequencies up to 2 kHz, it is possible to achieve triangular wave field amplitudes within the gap that are equally as high as present day ferrites, an alternative though generally more expensive material that can be used for constructing the magnets, that magnetically saturates at approximately 0.3 Tesla. The triangular waveform used to construct the solid curve 66 in FIG. 5b includes odd order harmonics up to the 21st order with amplitudes that give the most constant scan velocity over a scan phase angle of $-75°$ to $75°$, corresponding to 83% of the scan cycle. FIG. 5c shows the triangular waveform, with departure from a true sawtooth occurring at the extremities of the amplitude 64, as a result of limiting the number of harmonics to 21. FIG. 5d shows that for this harmonic range the scan velocity is constant to better than 0.2% over 150° of the scan cycle (i.e. 83% of the scan time). In practice, the scan amplitude is made sufficiently large such that the beam is outside the target perimeter during the time (17%) the scan velocity passes through zero and changes sign. Doubling the number of harmonics reduces the overscan time by approximately a factor of 2 (i.e. from 17% to 9%), for the same constancy in scan velocity. While the laminated scanner magnets of the preferred embodiment are able to accommodate harmonics above the 21st, typical power amplifiers that are presently commercially available limit the harmonics to a frequency range of 20–40 kHz.

Figure 6:
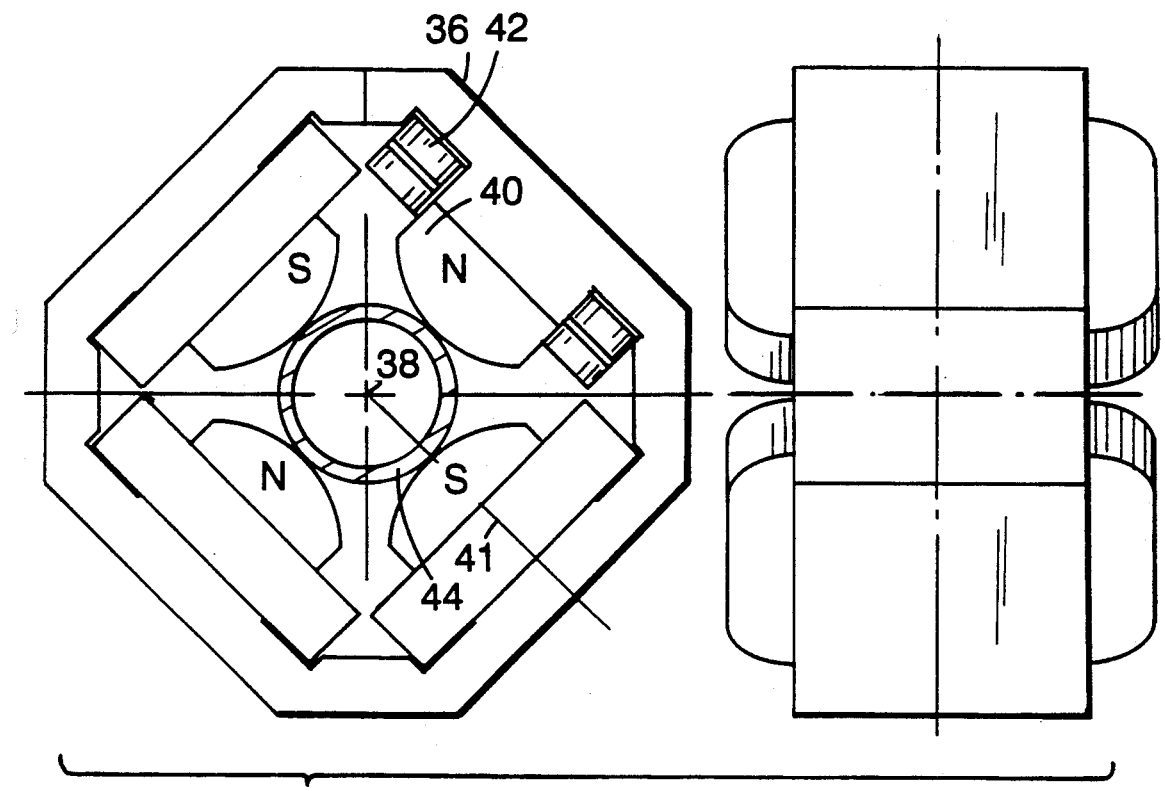

FIG. 6a is a cross section in the x-y plane, showing the basic structure of the magnetic quadrupoles 54, 56 and 58. Four poles 40 are arranged symmetrically about the symmetry axis 38 which, for the configuration shown in FIGS. 1a and 1b, coincides with the z-axis 32. The axes 41 of the poles are oriented at 45° to the x and y axes. Each pole is surrounded by a coil 42. All coils of a given quadrupole are identical with respect to physical form and number of turns, but are excited electrically to produce magnetic polarities, N S N S, on successive pole tips. The poles are constructed from high magnetic permeability steel alloy, as is the yoke 36 which provides a magnetic flux return between adjacent pairs of poles. The ion beam passes through the central region of the quadrupole inside the vacuum tube 44. With appropriate shaped pole pieces [REF 2], the magnetic field in the central region is essentially of pure quadrupole form:

$$B = +(B_0/r_0)\cdot(yi+xj) \qquad (5)$$

where i and j are unit vectors in the x and y directions, respectively, and $B_o$ is the magnetic field magnitude at the tip of the pole, at a distance $r_o$ from the symmetry axis 38. The Lorentz force [REF. 1] acting on a positively charged ion at position (x,y) is $$F = Qv \times B = -(B_0/r_0)\cdot(xi-yj)\cdot(2Q^2E/M)^{\frac{1}{2}} \qquad (6)$$

which, for $B_o > 0$, produces convergence in the x-direction and divergence in the y-direction, the force components in the x- and y-direction being respectively linearly dependent on the ion displacements x and y from the z-axis 32. The center quadrupole 56 has this polarity, while the first 54 and third 58 quadrupoles have the opposite polarity, causing x divergence and y convergence as illustrated by the behavior of the beam envelopes 60 and 61 shown in FIGS. 1a and 1b.

The final position and angle, relative to the z-axis 32, at which an ion impinges on the target 10 depends on the angular deflections received in the two scanners 26 and 28 and the integrated effect of the forces, as described by eq. (6), experienced in the three quadrupoles 54, 56 and 58. More specifically, consider an ion initially travelling along the z-axis 32 and entering the first scanner 26 at time t. The path described by this ion shall hereinafter be referred to as a "principal ray at time t". Physically, the principal ray is more or less the central ray of the entire ion beam at time t. The angular deflection $\alpha(t)$ of the principal ray generated in the first scanner depends on the value of the oscillatory magnetic field, averaged over the ion flight time through the scanner. The same is true for the angular deflection $\beta(t)$ generated in the second scanner. In most cases the ion flight time through a scanner is very much less than the oscillatory period of the scanner, in which case the time averaged field is, to first order, the "instantaneous field" the ion experiences when halfway through the scanner. Regardless, $\alpha(t)$ and $\beta(t)$ are oscillatory functions of time and, in general, principal rays belonging to different times t, experience different angular deflections. Also, $\alpha(t)$ and $\beta(t)$ are independent of each other, since they are generated in physically independent oscillatory fields. At any point along the beam path, the position and direction of a principal ray is characterized by 4 coordinates:

x: the x position relative to the z-axis 32.
x': the angle between the z-axis 32 and the ray projection on the z-x plane.
y: the y position relative to the z-axis 32.
y': the angle between the z-axis 32 and the ray projection on the y-z plane.

If the centers of the x and y scanners are at distances p and q respectively before the entrance boundary of the first quadrupole 54, the parameters of a principal ray at the entrance boundary, at time t are, in the paraxial ray approximation:

$$x_i = p\alpha(t), \quad x'_i = \alpha(t), \quad y_i = q\beta(t), \quad y'_i = \beta(t) \qquad (7)$$

Equation (6) shows that in a quadrupole the force components $F_x$ and $F_y$ are linearly dependent on x and y respectively. Consequently, the parameters of a ray at the exit of a quadrupole are homogeneous, linear transformations of the parameters at the entrance. Furthermore, according to eq. (6) the force $F_x$ in the x-direction does not depend on the y position of the particle and, correspondingly, $F_y$ does not depend on the x position of the particle. As a consequence, the x and y projections of the particle motion are decoupled. It follows that the motion of an ion passing through the three quadrupoles 54, 56 and 58, the field free drift spaces between the quadrupoles, and finally the field free drift to the target 10, can be regarded as a sequence of x-y decoupled, linear transformations. Thus, the parameters of the principal ray at the target can be expressed in the form:

$$x = M_{11}x_i + M_{12}x'_i = (M_{11}p + M_{12})\alpha(t) \quad (8a)$$

$$x' = M_{21}x_i + M_{22}x'_i = (M_{21}p + M_{22})\alpha(t) \quad (8b)$$

$$y = M_{33}y_i + M_{34}y'_i = (M_{33}q + M_{34})\beta(t) \quad (8c)$$

$$y' = M_{43}y_i + M_{44}y'_i = (M_{43}q + M_{44})\beta(t) \quad (8d)$$

Each coefficient $M_{rs}$ is a function of the pole tip fields $B_1$, $B_2$ and $B_3$ of the three quadrupoles:

$$M_{rs} = M_{rs}(B_1, B_2, B_3) \quad (9)$$

The precise functional form is dependent on the length and pole tip radius of each quadrupole, and on the spacing between the quadrupoles. In addition, the functional forms of $M_{11}$, $M_{12}$, $M_{33}$ and $M_{34}$ depend on the distance of the target 10 from the last quadrupole 58. According to the theorem of Liouville [REF. 3], the particle density in the x,x',y,y' phase space must be conserved during transport through the quadrupoles. In turn, since the x and y motions are decoupled, the determinants of the x,x' and y,y' transformations must each equal unity:

$$M_{11}M_{22} - M_{12}M_{21} = 1, \quad M_{33}M_{44} - M_{34}M_{43} = 1 \quad (10)$$

Consequently, only 6 of the 8 transformation coefficients $M_{rs}$ are independent. Since these coefficients are static with respect to time, eqs. (8a)-(8d) show that the target parameters x,x' and y,y' of the principal ray oscillate rapidly with time in precisely the same way as do $\alpha(t)$ and $\beta(t)$.

Figure 7:
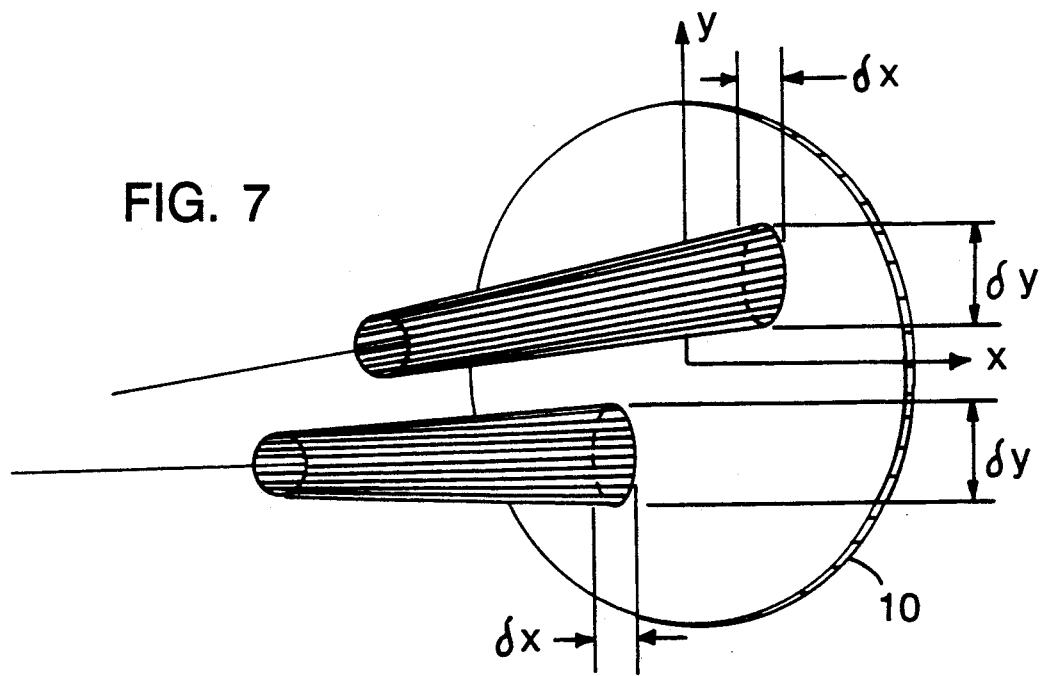
FIG. 7 is a diagram illustrating the constancy of the beam size at the target over the scan cycle.

FIG. 7 illustrates another aspect of the invention to do with the constancy of the beam size $\delta x$, $\delta y$ at the target 10, irrespective of the rapidly changing beam position. An ion which enters the first scanner magnet 26 at the same time as a principal ray, but displaced from the latter by an amount $\delta x_o, \delta y_o$ and describing a path with angular directions $\delta x'_o$, $\delta y'_o$ relative to the z-axis 32, arrives at the entrance to the first quadrupole 54 with parameters:

$$x_i = \delta x_o + px'_i \quad (11a)$$

$$x'_i = \alpha(t) + \delta x'_o \quad (11b)$$

$$y_i = \delta y_o + qy'_i \quad (11c)$$

$$y'_i = \beta(t) + \delta y'_o \quad (11d)$$

Applying the transformations through the quadrupoles according to eqs. (8a)-(8d), gives the parameters at the target 10 which are displaced from those of the neighboring principal ray by amounts $$\delta x = M_{11}\delta x_o + (M_{11}p + M_{12})\delta x'_o \quad (12a)$$

$$\delta x' = M_{21}\delta x_o + (M_{21}p + M_{22})\delta x'_o \quad (12b)$$

$$\delta y = M_{33}\delta y_o + (M_{33}q + M_{34})\delta y'_o \quad (12c)$$

$$\delta y' = M_{43}\delta Y_o + (M_{43}q + M_{44})\delta y'_o \quad (12d)$$

The beam size is thus constant because these displacements are independent of $\alpha(t)$ and $\beta(t)$ and hence time t. Intensity non-uniformities in the irradiation of target 10, that would otherwise arise with a varying beam size, are thus avoided. This is advantageous, for example, in semiconductor ion implantation where a high degree of dose uniformity is required. It should be emphasized that the constancy of the beam size is directly attributable to the linearity of the quadrupole action as expressed by eq. (6). Provided a quadrupole has precise 4-pole symmetry, there are no second order terms in eq. (6), for the usual case of a monochromatic beam (i.e. negligible momentum spread). By suitable pole shaping [REF. 2] and control of the fringing fields, the effects of the allowed higher order multipole components (e.g. 12- and 20-pole) can be minimized. Departure from linearity as small as 2% for 80% of the available quadrupole aperture is easy to realize in practice according to the specifications of commercial manufacturers [REF. 4].

Figure 8A:
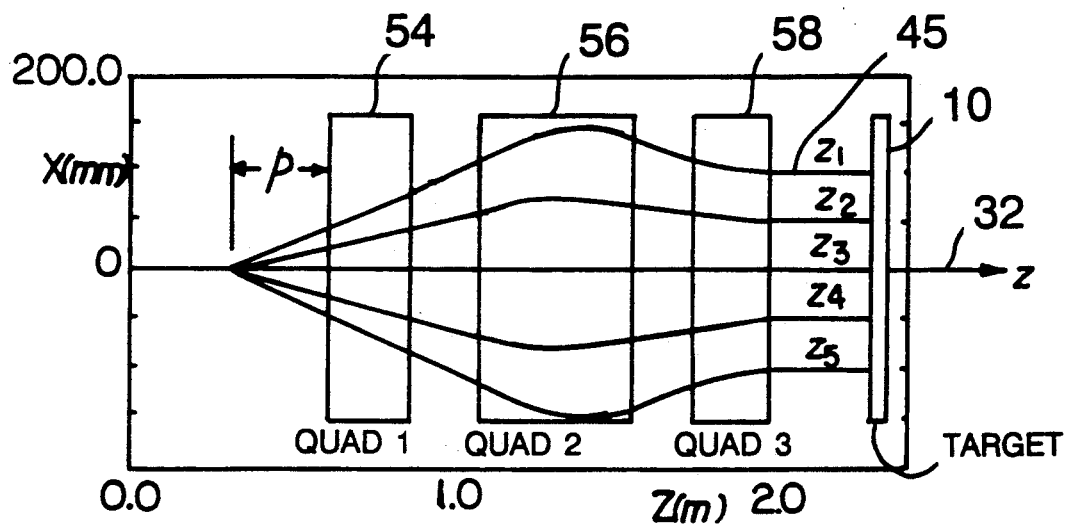
Figure 8B:
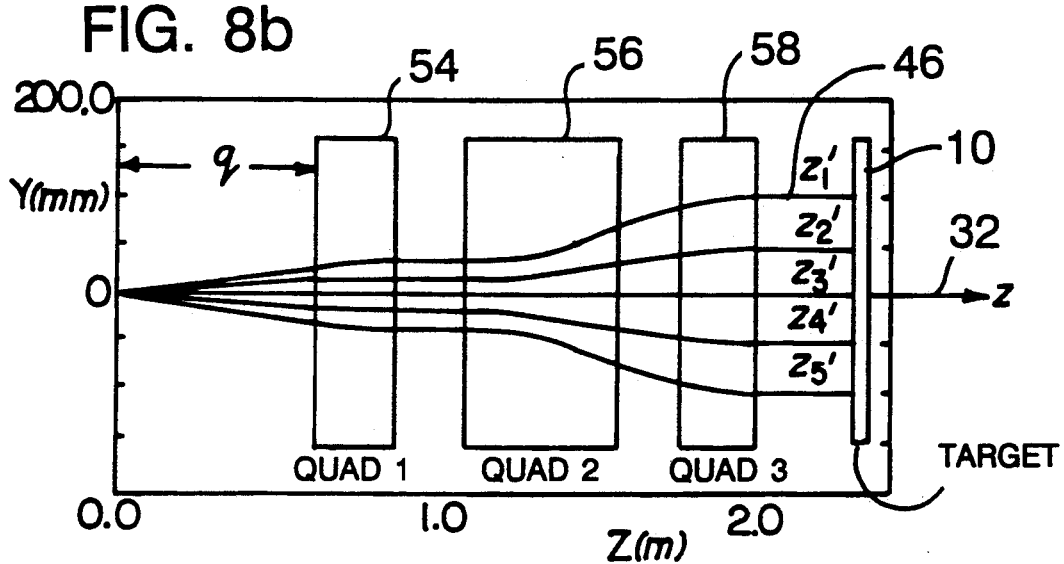

FIGS. 8a and 8b show yet another, advantageous aspect of the invention, wherein the two scanners 26 and 28 and the three quadrupoles 54, 56 and 58 cause the principal rays to emerge from the last quadrupole 58 parallel to the z-axis 32, irrespective of their rapidly oscillating position on the target 10. FIG. 8a shows the projection on the z-x plane of representative principal rays 45, occurring at 5 different times $t_1$ through $t_5$. FIG. 8b similarly shows the projection on the y-z plane of representative principal rays 46, occurring at another 5 different times $t'_1$ through $t'_5$. The parallel scanning mode is possible because the fields $B_1$, $B_2$ and $B_3$ in each of the three quadrupoles can be adjusted to relate the quadrupole transformation coefficients to the x- and y-scanner locations p and q according to:

$$-M_{22}/M_{21} = p \quad (13a)$$

$$-M_{44}/M_{43} = q \quad (13b)$$

Substitution of these results into eqs. (8b) and (8d) gives the two dimensional telecentric condition $$x' = y' = 0 \quad (14)$$

necessary for parallel scanning. An example of a set of quadrupole design and operating parameters, capable of generating parallel scanning over an 8 inch silicon wafer, is given in TABLE 1, in the Appendix.

Figure 9A:
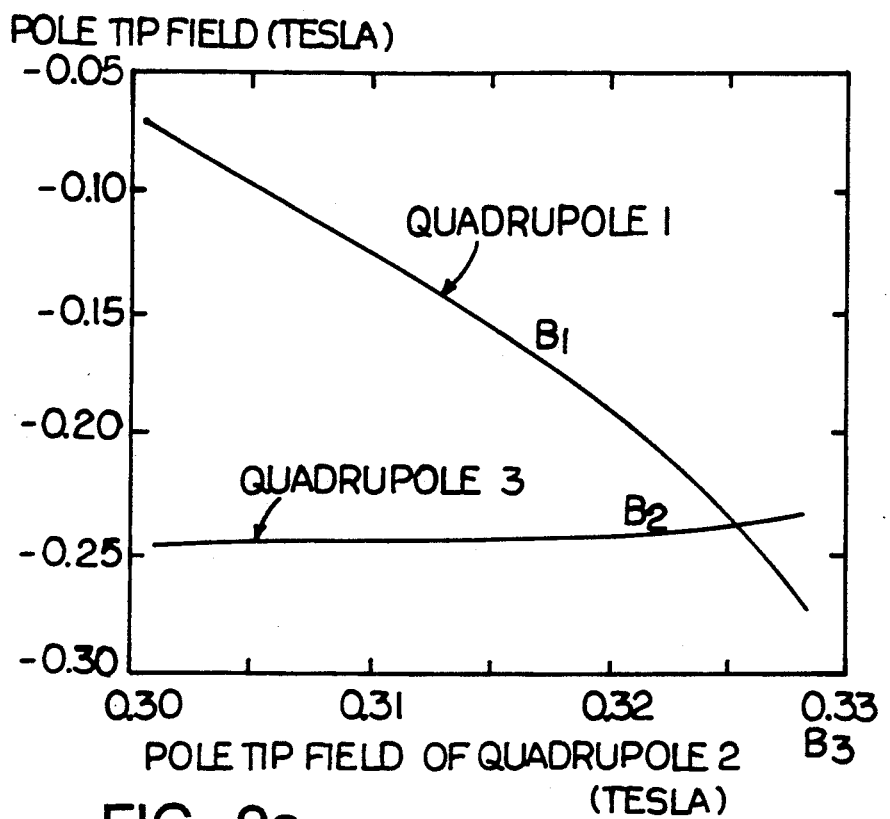
FIG. 9a is a plot for a typical embodiment of the different fields required for the first and third quadrupoles of FIG. 1a, with adjustment of the field of the second quadrupole, to maintain the telecentric condition.
Figure 9B:
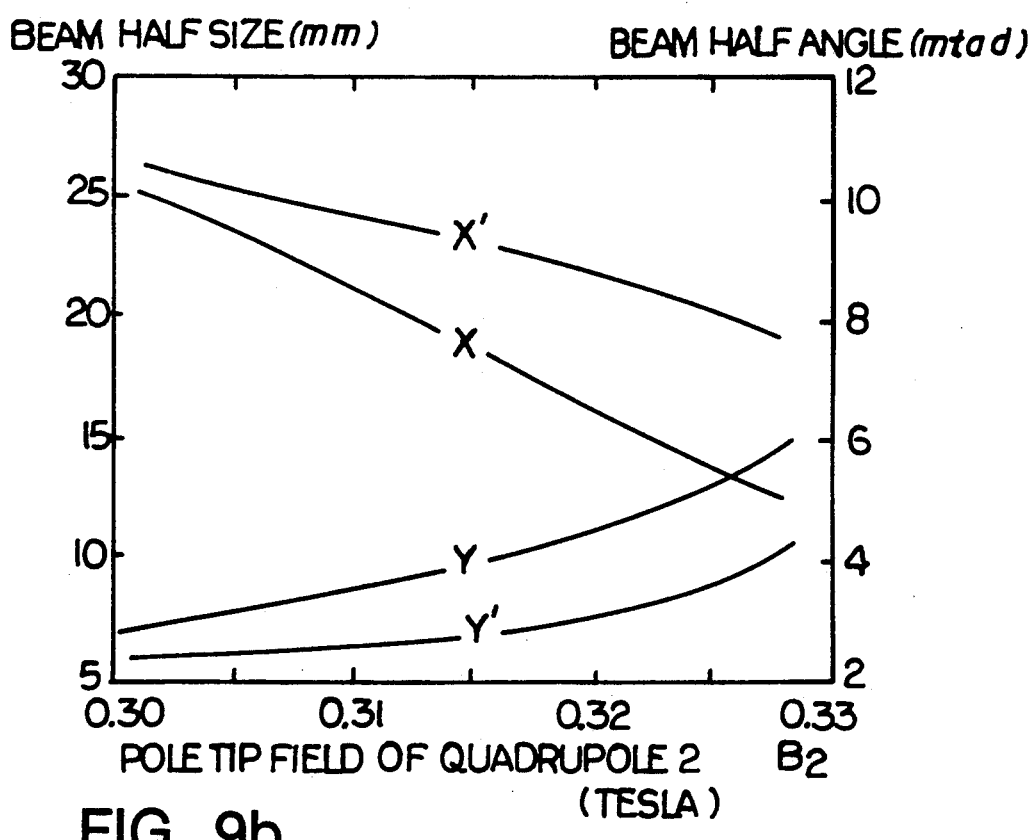
FIG. 9b is a plot for the conditions of FIG. 9a, of the change in beam half-size and half-angle with change in the field of the second quadrupole.

FIGS. 9a and 9b further show that the fields $B_1$, $B_2$ and $B_3$ in each of the three quadrupoles can be adjusted, not only to achieve parallel scanning, but also to simultaneously provide some degree of control and selectivity of the beam size and angular spread, $\delta x, \delta x', \delta y, \delta y'$, at the target 10. FIG. 9a gives, for the configuration described in TABLE 1, the fields $B_1$ and $B_3$ in the first and third quadrupoles, to maintain the telecentric condition of eqs. (13a) and (13b), for different values of the field $B_2$ in the second quadrupole. The field values apply to a 200 keV Arsenic ion beam. For other ion species and energies the quadrupole fields are scaled in proportion to the magnetic rigidity of the ion as defined in eq. (1). FIG. 9b gives the corresponding beam sizes and angular spreads X, X', Y, Y' at the target, for the case when the displacements $\delta x_o \delta x'_o$, $\delta y_o$, $\delta y'_o$ of the ions, at the cooled resolving slit 24, are bound to a beam envelope with half-sizes and angular spreads of:

$$X_o = 3 \text{ mm}$$

$$x'_o = 15 \text{ mrad}$$

$$y_o = 7 \text{ mm}$$

$$Y_o = 7 \text{ mrad} \tag{15}$$

and constrained to an elliptical emittance:

$$\{\delta x_o/X_o\}^2 + \{\delta x'_o/X'_o\}^2 \leq 1$$

$$\{\delta y_o/Y_o\}^2 + \{\delta y'_o/Y'_o\}^2 \leq 1 \tag{16}$$

The final beam size and angular spread at the target will depend on the parameters in eq. (15) defining the initial beam size, as well as on the emittance shape (eq. (16)). In turn, these depend on the emittance of the ion source 2 and the beam transformation properties of the momentum analyzer 6, the post-accelerator 8, and the neutral particle filter 14. In general, variations occur when the particle species or energy is changed. The fixed parameters of the quadrupole transport system, such as quadrupole lengths, spacings, and scanner locations p and q, are selected to optimize the beam at the target for a specific initial beam. For different initial beams the fields of the three quadrupoles are adjusted to optimize the beam size and angular spread at the target. The capability to control the beam characteristics at the target, as described in the preferred embodiment is advantageous, for example, in semiconductor ion implantation. As a beam is scanned across a wafer surface the scan velocity changes directions at the scan extremities, during which time the beam is outside the wafer perimeter in order to avoid non-uniformities in irradiation intensity (or dose uniformity). With a small beam size less time is expended over-scanning and the implantation process, correspondingly, has a high efficiency. On the other hand, in the case of a high current ion beam, the beam size must not be too small since a high power density causes damage to the wafer surface. Irrespective of the beam size and position, the deviation in angle of incidence on the wafer surface, from the z-axis 32, should typically be less than 10 mrad, in order either to avoid or utilize channelling effects, and avoid wall and trench shadowing on the wafer surface.

For the quadrupole configuration defined in TABLE 1, FIGS. 9a and 9b show that, for parallel scanning and an initial beam as defined in eqs. (15) and (16), setting the field $B_2$ of the second quadrupole at a value of 0.325 T (200 keV Arsenic) the maximum angular deviation from the z-axis 32 is $(X'^2 + Y'^2)^{\frac{1}{2}} \simeq 9$ mrad. The beam shape at the wafer is approximately round with a diameter of $2X \simeq 2Y \simeq 27$ mm. This is satisfactory in an ion implanter in which wafers are implanted serially, with beam currents up to 5 or even 10 mA. It should be noted that the angle of incidence on the wafer surface is selectable by appropriate orientation of the wafer surface relative to the z-axis 32. The preferred embodiment described herein enables such high beam currents to be rapidly, parallel scanned across the wafer, even for ions of low energy (5 keV), since the scanning and transformation elements are all magnetic, eliminating current limitations that otherwise exist as a result of space charge forces within the beam.

Figure 10A:
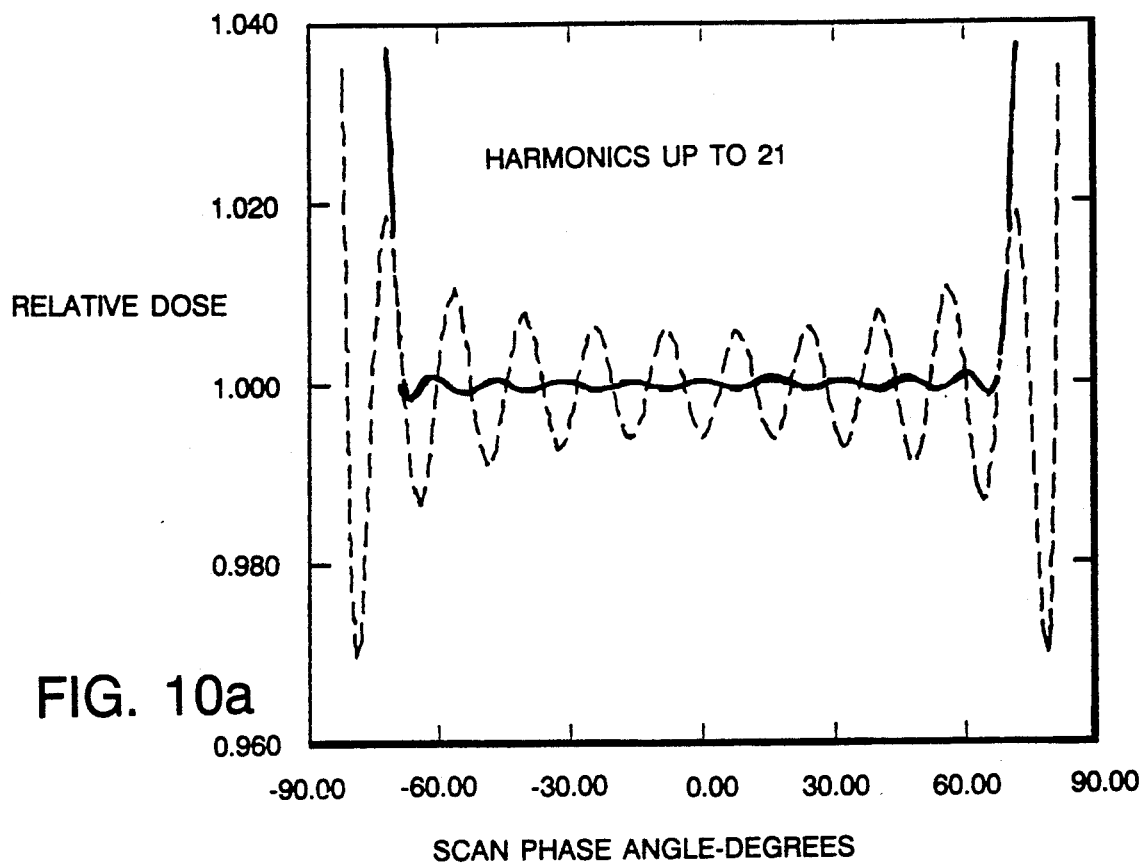
FIGS. 10a and 10b are plots of the relative irradiation dose for, respectively, harmonics up to 21 and 41, illustrating the smoothing effect of a finite beam size on target dose uniformity.
Figure 10B:
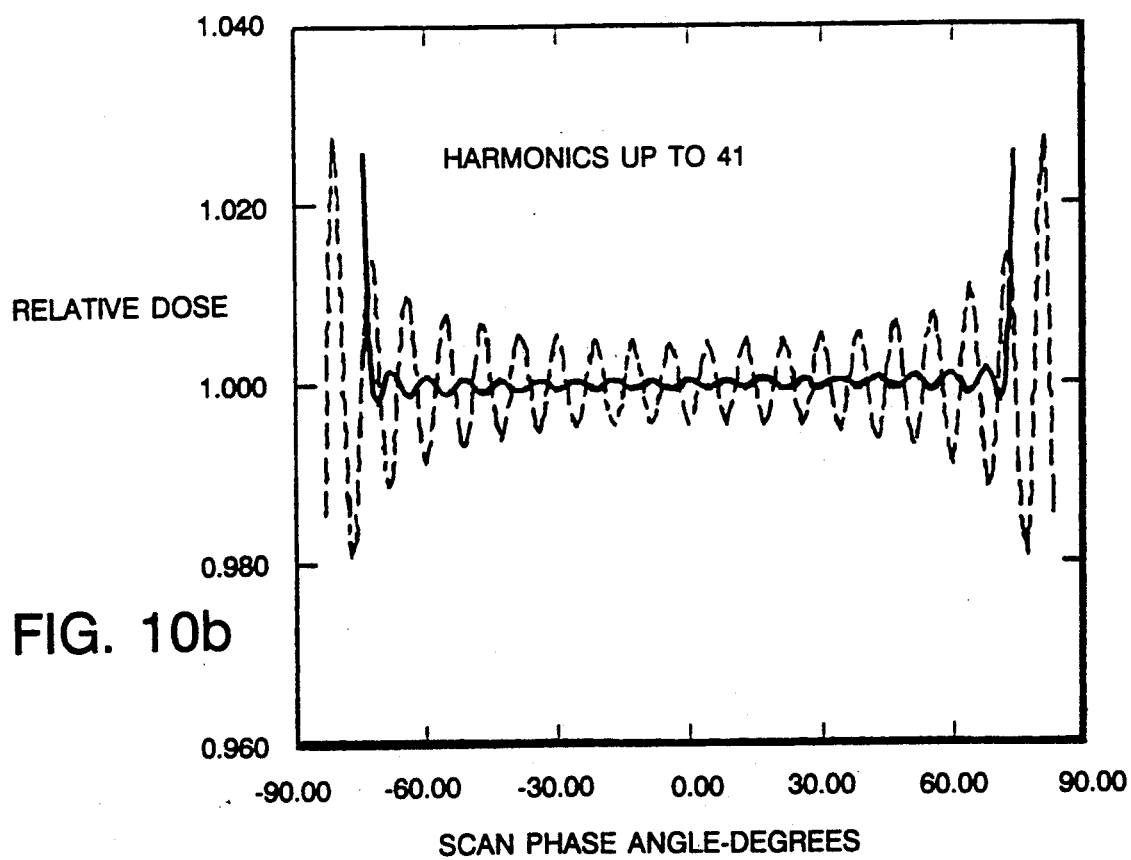

FIGS. 10a and 10b show the effect of a finite beam size on the target dose uniformity. With a point-like beam (not practical because of the very high power density) the dose uniformity (dashed curves in FIGS. 10a and 10b) exhibits moderate high frequency fluctuations when a finite number of harmonics compose the triangular magnetic field waveform in the scanner magnets. The finite harmonic content occurs in general as a result of the finite bandwidth of commercially available power supplies, irrespective of the magnetic frequency response of the laminated scanner magnets. The solid curves in FIGS. 10a and 10b show how the high frequency fluctuations are dramatically attenuated after averaging over the beam spot size on the wafer which, in this case, corresponds to a spread in the scan phase angle of 15° and thus a typical practical beam size for reasonable power density. Consequently, a finite number of higher order harmonics can generate a constant velocity scan, apart from high frequency fluctuations, over a larger portion of the scan cycle, approaching 170° out of 180° (94%). After averaging over the finite beam size of 15° halfwidth, FIGS. 10a and 10b show that a dose fluctuation of less than 0.2% is achieved over 140° and 145° of a scan half cycle for harmonics up to 21 and 41 respectively. The maximum possible uniform dose range for a 15° beam halfwidth is 150°, even for an infinite frequency response bandwidth. Thus, in the preferred embodiment, the loss in beam utilization, for 2D scanning, as a result of a finite frequency bandwidth, is only 7 to 13% (3.5 to 6.5% per scan axis).

In another operating mode of the preferred embodiment the quadrupole fields can be adjusted such that:

$$-(M_{22} - c_x M_{12})/(M_{21} - c_x M_{11}) = p \tag{17a}$$

$$-(M_{44} - c_y M_{34})/(M_{43} - c_y M_{33}) = q \tag{17b}$$

in which case the principal rays of the beam at the target are normal to a surface having curvatures $c_x$ and $c_y$ in the z-x and y-z planes, respectively. In particular, selecting $c_x = c_y$ enables normal irradiation of a spherical surface (concave or convex depending on the sign of $c_x$). Setting one or the other of the c coefficients to zero enables normal irradiation of a cylindrical surface. An advantage of normal or near normal irradiation is that it minimizes sputtering, e.g. in implantation of roller bearings and ball bearings.

Figure 17A:
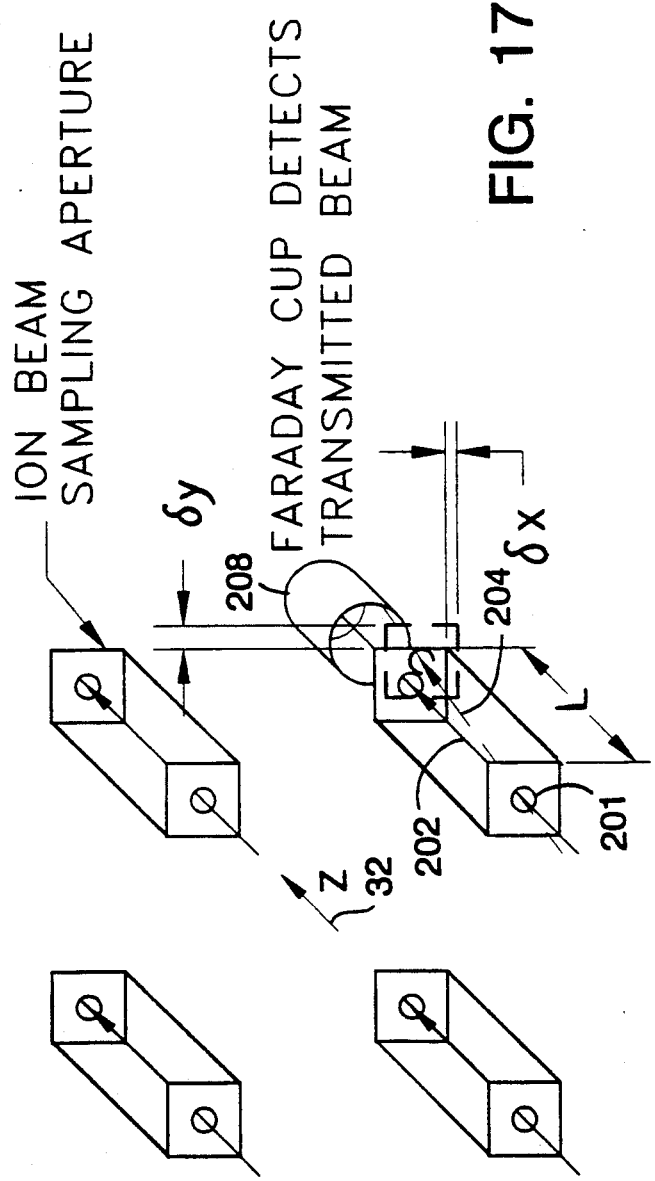
Figure 17B:
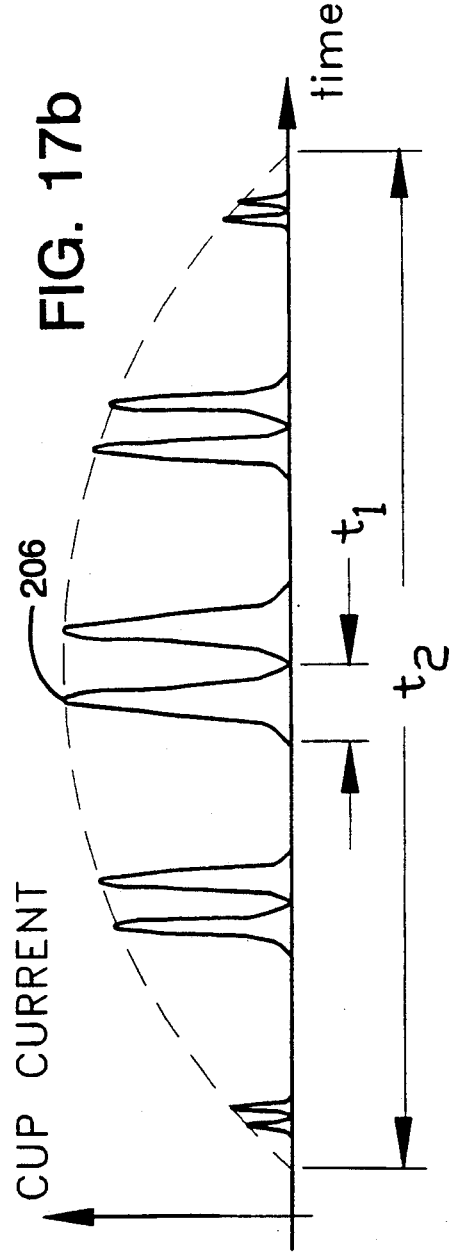
FIG. 17b illustrates the detector intensity versus time signal obtained from a pair of apertures as the beam scans across the apertures in raster fashion.

FIG. 17 shows the use of an array of 8 apertures 201, located after quadrupole 58 arranged in pairs with one pair located near each corner of the scan domain. The axis 202 of a pair of apertures have a prescribed direction relative to the z-axis 32. At some instant in time during a scan cycle ions pass through a pair of apertures only if the quadrupoles 54, 56, 58 are excited in a manner such that the principal ray 204 of the beam at that instant of time is coincident with the aperture axis 202. In this case a maximum electrical signal 206 is detected in a Faraday cup 208 as shown in FIG. 17a, which illustrates the signal obtained from a single aperture pair. The maximum electrical signal corresponds to a particular irradiation angle such as for parallel, convergent or divergent scanning as previously discussed in connection with eq. (17). The time duration $\bar{t}_1$ of a single electrical signal measured in the cup 208 is proportional to the y beam width (fast scan direction) while the time interval $\bar{t}_2$ between the first and last pulse in a contiguous sequence of pulses is a measure of the x beam width (slow scan direction). Finally, moving one aperture of a pair through a distance $\delta x$ (or $\delta y$) until the electrical signals just disappear provides a measure of the intrinsic angular deviation $x' = \delta x/L$ and $y' = \delta y/L$ in the beam where L is the spacing between a pair of apertures. In principle, only one pair of apertures is needed. However, with 4 pairs, such as shown in FIG. 17, verification can be made of the left-right and up-down scan symmetry.

In the preferred embodiment the first, y-scanner magnet 26, with a narrower gap, is scanned at a higher frequency than the second, x-scanner magnet 28, having a wider gap. As discussed earlier, this arrangement minimizes and avoids formidable operating powers for exciting the scanner magnets. In the preferred embodiment the y-scanner 26 operates at a frequency of 500 to 1000 Hz and the x-scanner 28 is operated at a frequency of 50 to 100 Hz. Consequently, the beam scans across the target 10 in a raster pattern. Exciting the scanner magnets with triangular oscillatory fields of the type shown in FIG. 5c produces a uniform scan velocity and hence a uniform irradiation dose in all but the overscan region, as shown in FIG. 5d. Patterned variations in dose resulting from a nonuniform intensity profile in the raster scanned beam are time averaged to nearly zero after several x scans (typically of the order of 100) by choosing an irrational number for the frequency ratio of the two scanner magnets. For example, $f_y = 200\pi$ Hz ($\simeq$ 628 Hz) and $f_x = 79$ Hz, gives $f_y/f_x = 7.9533991\ldots$, in decimal notation.

Figure 11:
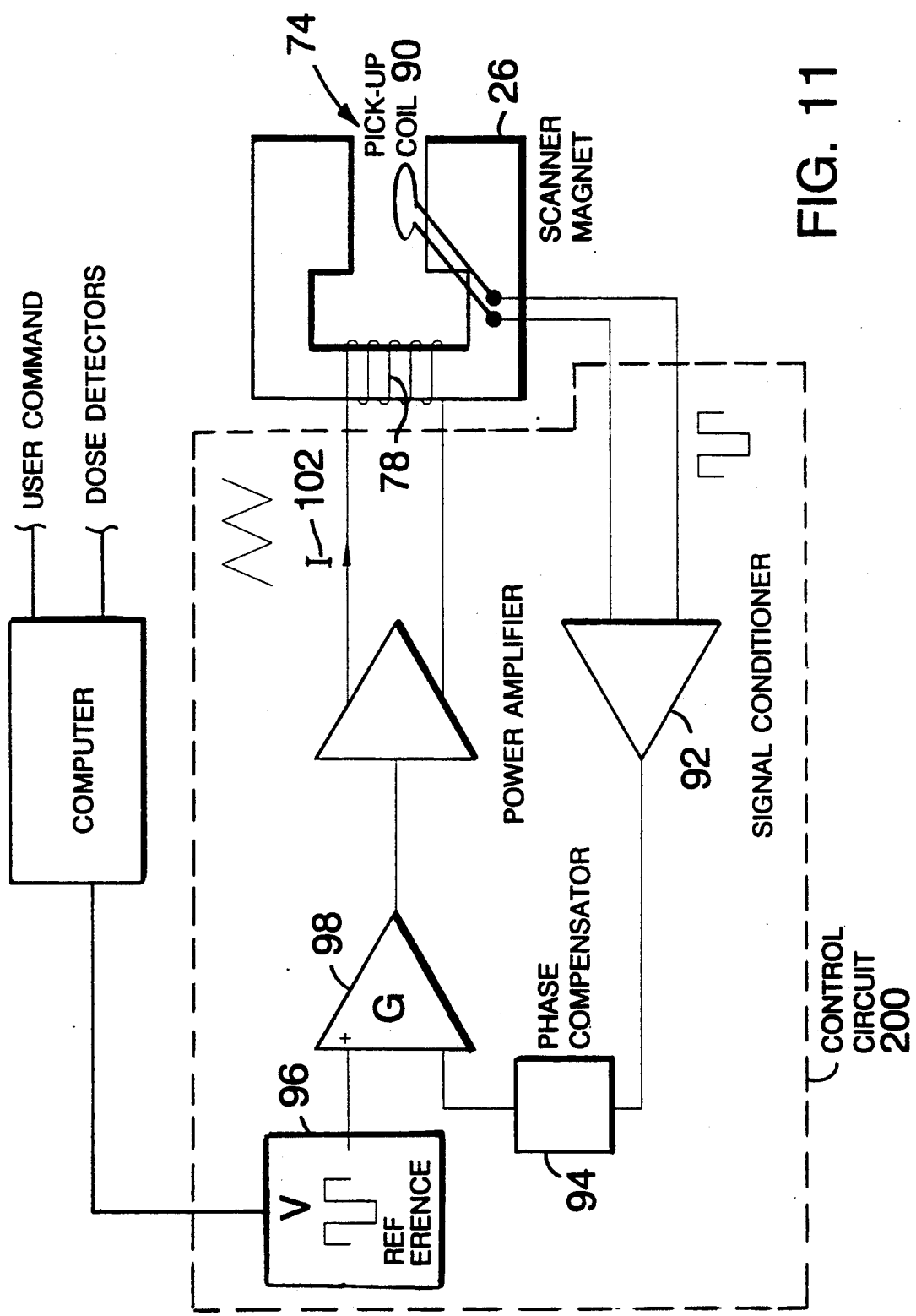

FIG. 11 shows schematically the electronic control circuit used to excite the oscillatory magnetic field in the scanner magnets 26 and 28 of FIG. 1a. A separate circuit and pickup coil is used for each scanner magnet. The circuits include a feedback loop, such that the amplitude and phase and waveform shape of the oscillatory magnetic field is controlled to cause the beam 60 of FIG. 1a to scan back and forth across the target 10 in a manner that generates a prescribed irradiation dose with a prescribed overscan region outside the target perimeter.

The control circuit 200 of FIG. 11 functions in the following ways: a voltage signal generated by the time varying magnetic field passing through the pickup coil 90 placed, e.g. in the gap 74 of the scanner magnet 26, is fed into a signal conditioner 92 followed by a phase compensator 94, and this resulting signal is subtracted from a reference waveform signal 96 to generate an error voltage, reflective of an error in the dosage being applied to the substrate. The error voltage is integrated and amplified with an appropriate gain G by an amplifier 98, and the resulting signal is added to the reference signal and applied to the input terminals of a power amplifier 100 which delivers a current I 102 to the coils 78 of the scanner magnet 26. The reference signal 96 represents the desired waveform that will be required for the voltage across the coil of the scanner magnet 26. The pickup coil 90 delivers a voltage signal to the signal conditioner 92 which is proportional to the rate of change of the flux linkages passing through the pickup coil 90, namely $$V_c = nA\, dB/dt \qquad (18)$$

where A is the area of the pickup coil 90 and n is the number of turns in the pickup coil 90.

Power amplifier 100 as shown in FIG. 11 operates as a voltage amplifier because it amplifies the voltage of the signal input given to it. The voltage V that this amplifier delivers to the coils 78 of the scanner magnet 26 is related to the current 102 that flows through the coils 78 of the scanner magnet 26 according to the following equation, $$V = L\, dI/dt + IR \qquad (19)$$

where R is the ohmic resistance of the coils of the scanner magnet 26 plus the load resistance representing the power losses in the laminations of the scanner magnet 26 resulting from the eddy currents and the magnetic hysteresis in the laminations and yoke, and L is the electrical inductance of the scanner magnet 26.

The magnetic field in the gap 74 of the scanner magnet 26 is approximately proportional to the current 102 flowing through the coils 78 of the scanner magnet 26 neglecting for the moment the small magnetic reluctance of the yoke structure of the magnet. Correspondingly, the rate of change of the magnetic field is proportional to the rate of change of current through the coils. Namely, $$dB/dt \simeq (\mu_o N/G)\, dI/dt \qquad (20)$$

where N is the number of turns in the magnet coil 78 divided by the gap G. G is the gap 74 of the magnet. To the extent that the inductive term in eq. (19) is very much greater than the resistive term, it follows that the voltage across the coil, V, is approximately equal to $$V \simeq (GL/\mu_o N)\, dB/dt \qquad (21)$$

Substituting eq. (18) into eq. (21) then leads to $$V \simeq GLV_c/(\mu_o NAn) \qquad (22)$$

Thus it follows that the voltage V that must be applied to the magnet coils 78 by the power amplifier 100 to achieve uniform dosage is proportional to the voltage $V_c$ detected by the pickup coil 90.

This simple relationship is only approximate and the signal conditioner 92 and phase compensator 94 are necessary in order to deliver to the power amplifier 100 a signal that exactly relates to the voltage that must be delivered to the coils 78. The signal conditioner 92 conditions the signal by adjusting the gain and shape of the signal and also eliminates any distortions of the signal associated with the circuitry. The phase compensator 94 is needed because there is always a phase shift arising from electronic delay times. There is also a phase shift between the current and magnetic field of the scanner magnet as a result of the finite permeability of the yoke material.

The signal from the pickup coil 90 is proportional to the time rate of change of the magnetic field in the magnet 26. The scan velocity of the beam across the target 10 is also directly proportional to the rate of change of magnetic field in the scanner magnet 26. Indeed, differentiating eqs. (8a)–(8d) shows that $dx/dt$ is proportional to $d\alpha/dt$, and is in turn proportional to $dB/dt$. Thus the signal from the pickup coil 90 is a direct measure of the scan velocity of the beam across the target 10. The dose delivered to the target per unit time, is proportional to the reciprocal of the scan velocity, and therefore the reciprocal of the voltage signal $V_c$ measured in the pickup coil 90. Because the deflections given to the ions are generated purely from magnetic fields, electric fields, being absent, do not cause any perturbation of this condition and an advantageous feature of the preferred embodiment is the fact that the dose uniformity can be precisely controlled by the circuit of FIG. 11. The deviations from the desired dose profile will correspond to deviations from the corresponding voltage profile and can be continuously corrected during operation by adjusting the reference signal 96.

The power amplifier 100 may be operated as a current rather than voltage amplifier wherein it delivers to the scanner magnet 26 a current that is proportional to its input current. Rather than the square wave voltage reference signal 96 illustrated in FIG. 11, a triangular waveform of the type in FIG. 5c is used as a reference signal. The signal conditioner 92, in accord with equation (18), integrates the signal from the pickup coil 90 to generate the waveform to be compared with the reference signal. With electrical deflection systems, the scan velocity can be monitored, at least in principle, by measuring the rate of change of voltage applied to the electrical deflection plates. However, as the beam currents become higher and space charge forces become greater, the voltage signal measured from these deflector plates is no longer simply related to the scan velocity that the electric field between the plates generates with the beam. In fact, at some current the scanning action deteriorates almost completely. For beams with a high perveance ($I/E^{3/2}$), it would not be possible to have a feedback system analogous to that described in FIG. 11 that reliably controlled the dose uniformity.

The preferred embodiment makes use of modern high-speed digital electronics to implement the feedback loop as described in FIG. 11. The analog signal from the pickup coil is digitized and the phase compensation and signal conditioning is then carried out digitally. Correspondingly, the reference signal is synthesized digitally. The digital implementation has the advantage of being able to operate the feedback loop in a precise mathematical way, avoiding the instabilities that are often present in a pure analog feedback circuit.

In practice, both the power amplifier 100 and the scanner magnet 26 have a finite frequency response. Harmonic components above a certain frequency will not be transmitted to the coil current 102 as a result of the frequency response limitations in the power amplifier 100, nor to the magnetic field as a result of the frequency response limitations of both the power amplifier 100 and the scanner magnet 26. However, as shown in FIGS. 10a and 10b, truncating the frequency components in the Fourier series to include only those below approximately 20–40 kHz leads only to a slightly rounded sawtooth, as illustrated in FIG. 5c. The frequency response of the scanner magnet 26 has been previously discussed, and is illustrated in FIGS. 5a and 5b. Commercially available power amplifiers have two limitations which prevent them from generating a perfect sawtooth waveform. One is their intrinsic frequency bandwidth capability, and the other is that to generate a sawtooth waveform requires a voltage to be delivered to the magnet coil that is approximately of a square wave shape, as shown in the reference signal 96, of FIG. 11. The square wave shape has the characteristic that at the end of a scan half-period, the voltage must be suddenly reversed in magnitude. Commercial power amplifiers always have a limited voltage slew rate, a limit to the rate at which that voltage can be reversed. During the time the voltage is being reversed, the beam is in the overscan position on the target, so the precise waveform is no longer important. The highest possible slew rate is desirable. Commercial amplifiers at this time have slew rates of approximately 40 microseconds ($\mu$sec) from a full positive voltage to a full negative voltage, which is a small fraction of the scan period of about 500 $\mu$sec for scan frequencies up to 2 kHz.

Reference 5 provides a reference of commercially available power supplies. They are capable of exciting highly inductive loads, such as in a scanner magnet, with very high efficiency and very little internal power loss. The pulse width modulated operation, however, generates high frequency ripple in the voltage output from the power amplifiers, typically 40–80 kHz and of 1–3% magnitude. Ripple voltage applied across the coils from this source directly generates a ripple in the dose uniformity according to eqs. (19) and (20). However because the beam has a finite size at the target, and because this ripple frequency is much greater than the scan frequency, typically by almost two orders of magnitude, the ripple in dose uniformity is greatly attenuated. Just as the fluctuations in dose uniformity from a limited number of higher order harmonics are greatly attenuated by the finite beam width as illustrated in FIGS. 10a and 10b, the same is true for the ripple component arising from voltage ripple in the power amplifier. Indeed, for ripple voltage amplitudes as high as 3%, and typical beam width sizes corresponding to a scan phase angle range of 15°, the effect of the ripple on dose uniformity is much less than 0.1%.

If the beam at the target were focused by the quadrupoles 54, 56 and 58 to be point-like in nature (a condition not employed in ion implantation), then in a single scan across the surface of the wafer the ripple associated with the power amplifier 100 and the fluctuations associated with the limited number of harmonics in the waveform as a result of the bandwidth limitations of the power amplifier 100 would be evident in the dose uniformity. But even then, after several scan cycles the ripple is greatly attenuated by pre-selection of the scan frequency so that the ripple frequency is not an integral multiple of the scan frequency.

ALTERNATIVE EMBODIMENTS

FIG. 12 shows an alternative embodiment for the two scanner magnets wherein the two dimensional scanning of the beam at the target previously generated with two separate scanner magnets, one causing oscillatory motion of the beam at the target in the x-direction, and the other causing oscillatory motion at the target in the y-direction, is replaced by a single structure achieving the same end result.

Figures 12B, 12C, 12D:
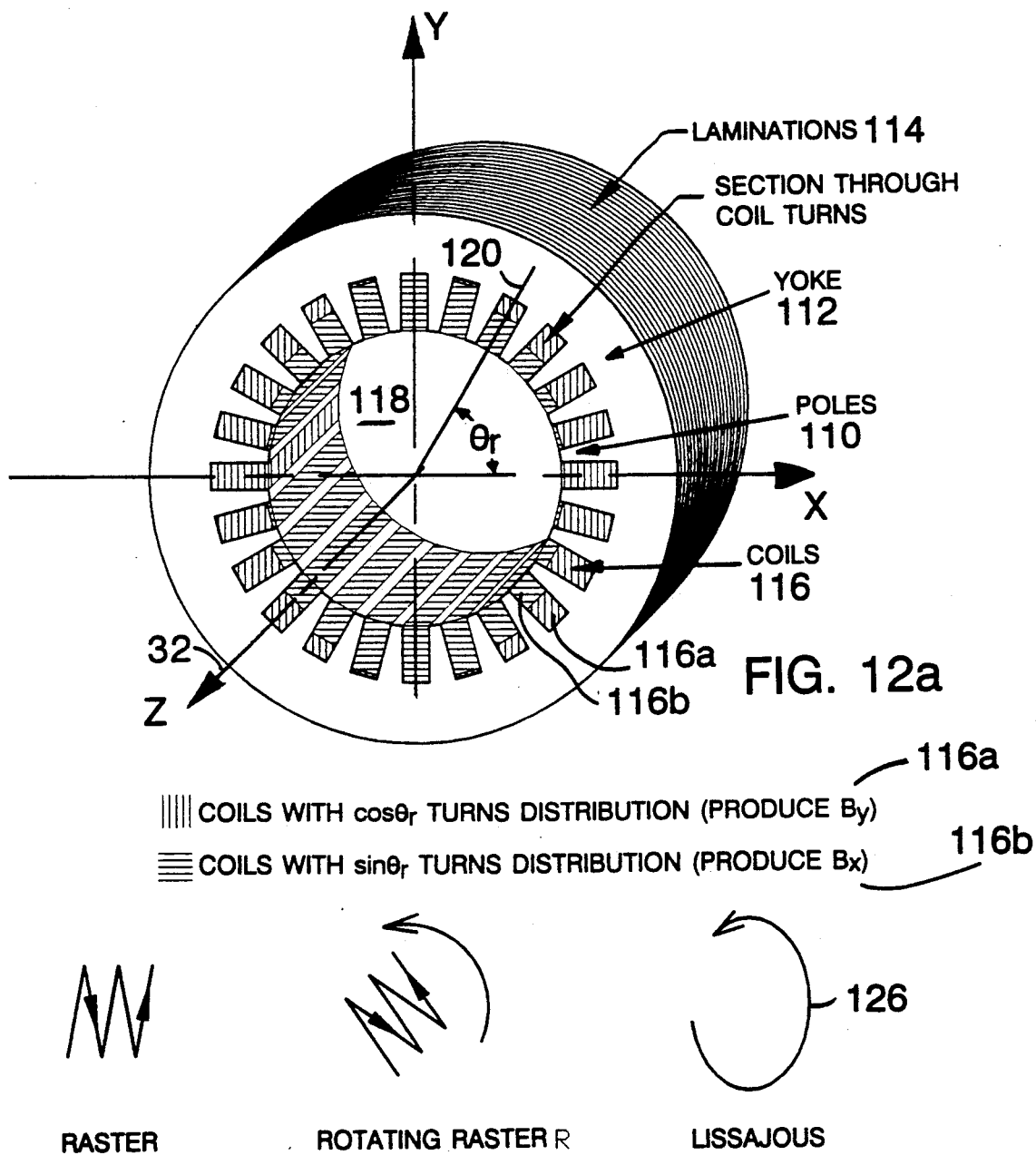
FIG. 12a is a schematic perspective view of the scanning system of an alternate embodiment employing a single structure for x- and y-scanning, while FIGS. 12b, 12c and 12d, respectively, illustrate various scan patterns that can be achieved with respectively different excitations of the coils 116a and 116b.

There are a multiplicity of poles 110, all magnetically connected through a yoke 112. In order to reduce eddy currents, both the yoke 112 and the poles 110 are composed of ferromagnetic laminations 114. Coils 116 (coils 116b for $B_x$ and coils 116a for $B_y$) surround each pole and can be excited independently to generate an oscillatory magnetic field within the region 118 enclosed by the yoke and pole structure. Because there is a large number of independent poles around the periphery, the excitation currents of each coil 116 can be adjusted in phase and amplitude such as to produce a transverse magnetic field 120 perpendicular to the z-axis 32, but oriented at any angle in the x-y plane. If there are an even number of poles located in the x-y plane, at equally spaced angles $\theta$hd 1, $\theta_2$, $\theta_n$, and if the number of turns of the coil 116a located on the pole at angle $\theta_r$ is proportional to the absolute value of cos $\theta_r$, then when all such coils are connected in series and excited, an oscillatory magnetic field is generated in the y-direction. If a further set of coils 116b are located on the poles such that the number of turns on the pole at angle $\theta_r$ is proportional to the absolute value of sin $\theta_r$, and these coils are all connected in series, then an oscillatory magnetic field in the x-direction is generated. The two sets of coils can be excited to generate various scan patterns:

a) If the excitation currents in the two sets of coils are independent and at a quite different frequency, a raster scan is generated, FIG. 12b;

b) If low and high frequency currents are superimposed in each of the two coils and if the amplitudes of the component currents are modulated slowly with time, a raster scan is again produced at the target 10, but at an orientation angle which rotates slowly about the z-axis 32, FIG. 12c;

c) If the frequency of excitation of the currents in the two coils is the same, but their relative phase is different from zero, then the beam at the target 10 executes a Lissajous motion and can trace out in general an elliptical path 126 centered around the z-axis 32, FIG. 12d. As a special case if their relative phase is 90°, a right elliptical or even circular trace is generated.

Similar results to that described in (b) are achieved if the target 10 is mechanically rotated around the z-axis 32 whilst being implanted. The ability to vary the scan orientation in the x-y plane is not possible with the fixed x- and y-scanner magnets 26 and 28 shown in FIGS. 1a and 1b. This alternative wherein the two scanner magnets are combined into a single unit does not however offer the same possibilities for minimizing the excitation power as offered by the separated scanner magnets. Note that the excitations of the quadrupoles 54, 56, 58, must be adjusted such that the distances p and q of FIGS. 8a and 8b are equal when a scanner such as that shown in FIG. 12 is used.

Figure 13:
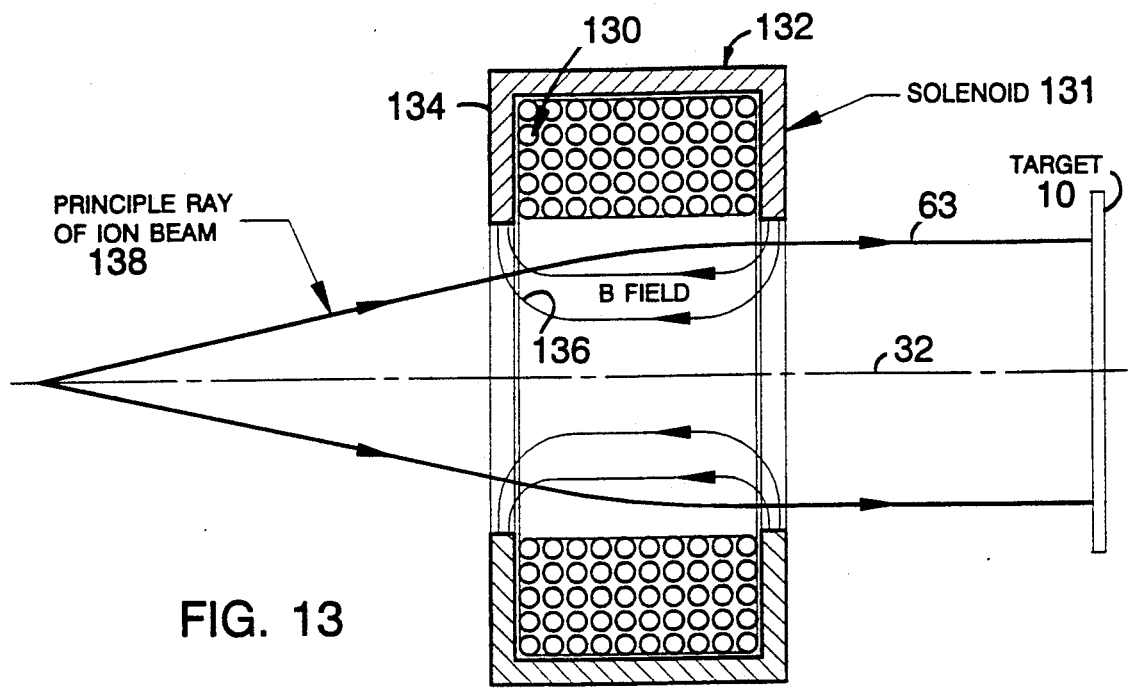

FIG. 13 shows the use of a magnetic solenoid 131 that can serve as a telecentric transport system to provide the transformation from the region of the scanner poles to the target 10. The solenoid consists of current carrying coils 130 symmetrical about the z-axis 32 and to improve the magnetic efficiency, a cylindrical yoke 132 with planar end pieces 134 constructed of ferromagnetic material. The magnetic field 136 acts as a lens causing the beam 138, entering the solenoid but displaced from the z-axis 32 as a result of the action of the scanner magnets to undergo further angular orientation and displacement from the z-axis 32. Again, the solenoid is a linear device as are the quadrupoles, and the final position and angle at which the beam 138 impinges on the target 10 is, like the case of the quadrupoles, a linear function of the angular direction and displacement of the beam 138 upon entering the solenoid. The equations describing the effect of the solenoid would be similar to those of equations (8a)-(8d), except because the solenoid has axial symmetry with respect to the z-axis 32 $M_{11}$ would equal $M_{33}$, $M_{22}$ would equal $M_{44}$, $M_{12}$ would equal $M_{34}$, and $M_{21}$ would equal $M_{43}$. Such a solenoid would generally be used with a scanner of the form described in FIG. 12a because the center for the x and y scans would be the same position on the z-axis 32. In addition to generating focusing of the beam 138 a solenoid simultaneously generates a rotation of the beam 138 about the z-axis 32 resulting from coupling of the x and y motions.

If the single solenoid is replaced by an axial sequence of two solenoids of similar construction with excitation currents in the two coils arranged to oppose each other, the net rotation after passing through the two solenoids is zero, but the focusing action is maintained and is approximately equal to the focusing action of a single solenoid of the same length as the combined lengths of the two solenoids. The two solenoids are separated physically. The magnetic field at the center of the first solenoid is in the opposite direction to that of the second solenoid. The angular rotation is dependent on the direction of this magnetic field, and is thus equal and opposite in the two solenoids. On the other hand, the focusing action depends only on the magnitude of the field and not on the direction.

Figure 14:
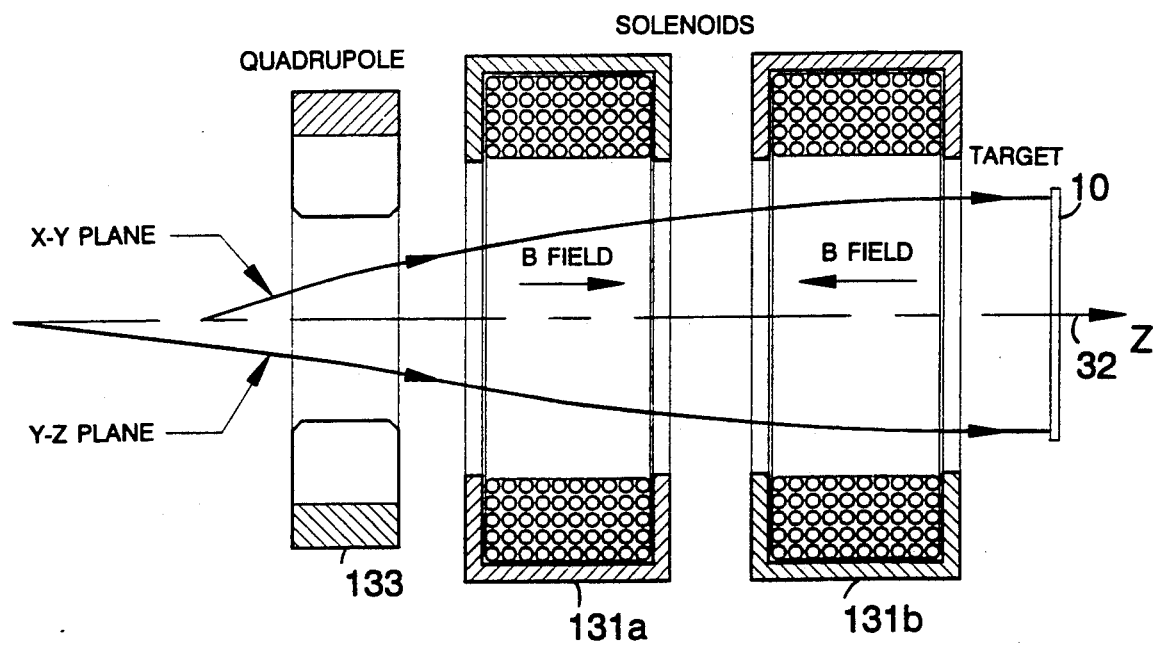
FIG. 14 is a cross-sectional view of a magnetic ion beam transport system comprising a sequence of two solenoids preceded by a quadrupole, useful, for instance, with the system of FIG. 1a, to replace the three quadrupoles shown there.

Referring to FIG. 14, in yet another variation of the preferred embodiment, a pair of 131a and 131b solenoids (or a single solenoid, not shown) can be combined with a quadrupole singlet such that the centers of the scanner magnets can be separated in position on the z-axis 32 as illustrated in FIG. 14. The quadrupole Q and solenoid S excitations can be adjusted such that a parallel scan beam can be generated at the target 10, in much the same way that this is achieved with the three quadrupoles 54, 56, and 58 of FIGS. 1a and 1b.

Figure 15A:
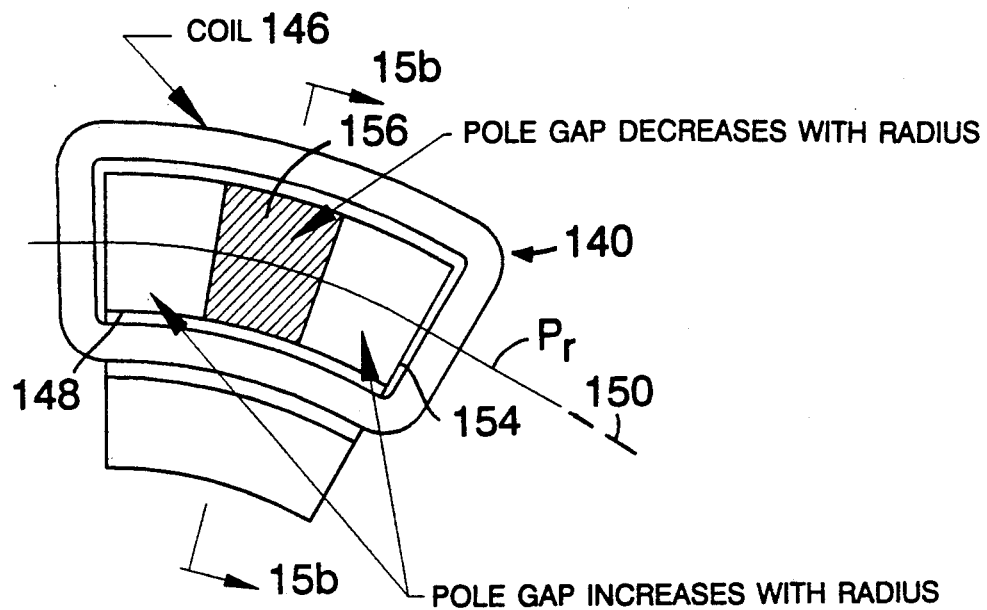
FIG. 15a is a cross-section taken along the beam axis.
Figure 15B:
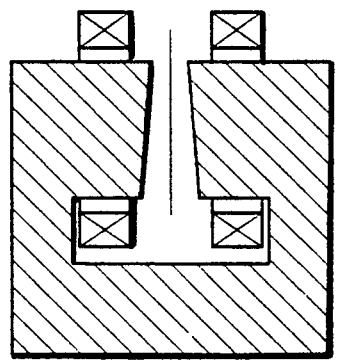
FIG. 15b is a cross-sectional view on line 15b . . . 15b.
Figure 15C:
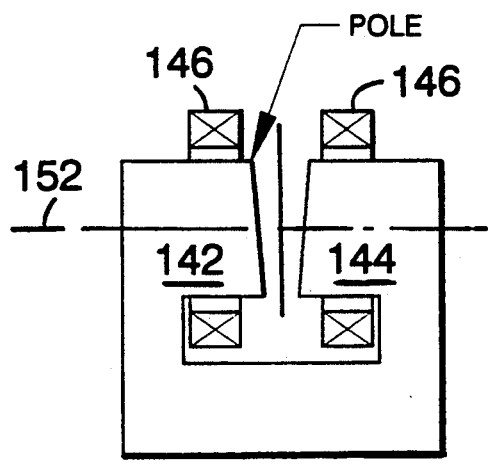
FIG. 15c is an end view of a bending magnet constructed to produce quadrupole fields to serve as a magnetic ion transport system useful with the system of FIG. 1a in place of the set of quadrupoles.

FIGS. 15a, 15b and 15c show yet another variation of the preferred embodiment wherein the three magnetic quadrupoles 54, 56, and 58 are replaced by a bending magnet 140. The bending magnet 140 has two poles, 142 and 144, each surrounded by a coil 146. The gap between the poles can be made to vary with position on the pole surface such that magnetic fields having quadrupole terms superimposed on dipole terms are generated. The action of such a magnet can be made so that these quadrupole fields perform the same function that the individual quadrupoles 54, 56, and 58 perform. The dipole component in the magnetic field causes the principal rays $P_r$ to bend as shown in FIG. 15a. In this case the exit beam axis 150 is at a different angle from the incident axis 152. If the pole gap in the first section of the magnet 148 and the third section of the magnet 154 increases radially outwards, while the pole gap in the center section of the magnet 156 decreases, not increases radially outwards, then the quadrupole components in the magnet replicate the action of the individual quadrupoles 54, 56, and 58 shown in FIG. 1a. Such a bending magnet becomes a very large structure when large targets 10 are needed, because the pole gap must be at least as large as the target 10, and the pole width must be at least three times that of the pole gap. On the other hand, a bending magnet device 140 does offer the advantage of preventing unwanted particle species that are still in the beam at the entrance to the magnet from ever reaching the target 10. Because the bending magnet 140 has a dipole field component, it provides momentum dispersion and can further purify the beam delivered to the target 10 from unwanted particle species contamination.

Other alternative embodiments of the magnetic transport system include a bending magnet followed by a quadrupole or a solenoid, not shown, that can be used to enable adjustment of the spot size of the beam at the substrate and the convergent, parallel or divergent relationship of the beam to the axis.

Clearly other combinations of the above described alternates to the preferred embodiment can be used to achieve the same end result. Indeed, four quadrupoles can be used in place of three, which can be an advantage if even greater independent control of the beam size at the target 10 is required.

SUMMARY OF OPERATION AND PERFORMANCE OF THE PREFERRED EMBODIMENT

Consider the specific case of a 200 keV singly charged arsenic ion beam that is to be raster scanned at a frequency of 1000 Hz in the y-direction and $30\pi 894.2478$ Hz in the x-direction such as to give a uniform dose over a 150 mm diameter wafer.

The quadrupoles are set with the parameters described in TABLE 1, which appears as an appendix to this specification. This produces a parallel scanning of the beam across a wafer because at these settings the three quadrupoles 54, 56, 58 cooperate such that the x and y object points for the three quadrupole combination occurs respectively at the center of the x-scanner magnet 28 and the y-scanner magnet 26—i.e. the telecentric conditions expressed by eqs. (13a) and (13b) are satisfied. In general, the quadrupole fields can be set by using a magnetic probe such as a hall effect device to measure the quadrupole field, and by observing the electrical signals from the beam transmitted through apertures such as shown in FIG. 17.

For a typical ion source 2, analyzer magnet 6, post accelerator 8, and neutral filter 14, the emittance of the ion beam can be as given by eqs. (15) and (16). In this case the size and angle parameters of the beam at the wafer are as given in FIG. 9(b) for $B_2 = 0.321$ T (the pole tip field of quadrupole 56). Other beam sizes at the wafer can be selected and the parallel scanning condition preserved by adjusting the fields in the three quadrupoles in coordination according to the data shown in FIGS. 9(a) and (b).

The scan range at the wafer, in the x and y directions, is given by eqs. (8a) and (8b), and depends on the deflection angles $\alpha$ and $\beta$ generated in the scanner magnets 28 and 26 respectively. As an example, for a scan range of $\pm 90$ mm, sufficient for overscanning 150 mm diameter wafers, and making use of eq. (10) and the telecentric condition in eqs. (13a) and (13b):

$$\alpha = -90M_{21} = 117 \text{ mrad} \qquad (23a)$$

$$\beta = -90M_{43} = 41 \text{ mrad} \qquad (23b)$$

To produce these deflection amplitudes the scanners must be excited with an rms power as given by eq. (3) but modified for a triangular rather than sinusoidal waveform in order to realize a uniform dose. This amounts to replacing the constant of 7.5 by 5.0 in eq. (3). For the first scanner magnet 26, operating at 1000 Hz, assuming a gap of 0.02 m and a length of 0.15 m, and using a magnetic rigidity of $K = 0.557$ T-m for 200 keV singly charged arsenic ions as calculated from eq. (1), the rms operating power is $$P_1 = 6.96 \ kVA \qquad (24)$$

For the second scanner magnet 28, operating at 94.2478 Hz, and assuming an entrance gap of 0.03 m, an exit gap of 0.06 m, and a length of 0.4 m, $$P_2 = 9.38 \ kVA \qquad (25)$$

The appropriate excitation power of the scanners can be set experimentally by monitoring the peak magnetic field via a pickup coil and integrator as previously described. If the effective length of the two scanners are $L_1$ and $L_2$ respectively, then the respective peak fields are set to values of $$B_1 = (K/L_1) \sin \alpha = 0.15 \ T \qquad (26a)$$

$$B_2 = (K/L_2) \sin \beta = 0.16 \ T \qquad (26b)$$

For other ion species and/or energies, the quadrupole and scanner excitation fields must be adjusted in proportion to the magnetic rigidity of the ion as given by eq. (1).

Since electric fields are absent in the scanner magnets and quadrupoles, space charge forces are also absent and there are essentially no restrictions placed on the ion beam perveance ($I/E^{3/2}$).

Many different embodiments are possible within the spirit and scope of the invention, and will depend e.g. upon such factors as the particular tasks at hand, the availability and cost of materials, and the particular design preferences of the user. For instance, when operating in the low or medium perveance ranges the transport systems according to the present invention may be used in combination with electrostatic scanners.

Two appendices are attached.

For references cited above in text, see Appendix B.

TABLE 1

| Appendix A Quadrupole Parameters | |
|---|---|
| Locations Along the z-axis 32 (m): | |
| 'x' Object Point to Quad 1 Entrance (p) | 0.25 |
| 'y' Object Point to Quad 1 Entrance (q) | 0.55 |
| Effective Length Quad 1 | 0.36 |
| Spacing Quad 2 to 3 | 0.10 |
| Effective Length Quad 3 | 0.60 |
| Spacing Quad 2 to 3 | 0.07 |
| Effective Length Quad 3 | 0.36 |
| Exit of Quad 3 to Wafer | 0.25 |
| 'y' Object Point to Wafer | 2.29 |
| Quad 1 Parameters for 200 keV As$^+$ Ions: | |
| Aperture Diameter (mm) | 200 |
| Width (mm) | 690 |
| Pole Tip Field (T) | 0.198 |
| Total Coil Power (kW) | 1.9 |
| Quad 2 Parameters for 200 keV As$^+$ Ions: | |
| Aperture Diameter (mm) | 280 |
| Width (mm) | 1000 |
| Pole Tip Field (T) | 0.321 |
| Total Coil Power (kW) | 7.8 |
| Quad 3 Parameters for 200 keV As$^+$ Ions: | |
| Aperture Diameter (mm) | 240 |
| Width (mm) | 820 |
| Pole Tip Field (T) | 0.243 |
| Total Coil Power (kW) | 3.1 |
| Transfer Matrix Elements from Entrance of Quad 1 to Target | |
| $M_{11}$ | 0.042 |
| $M_{12}$ (mm/rad) | 0.756 |
| $M_{21}$ (mrad/mm) | −1.305 |
| $M_{22}$ | 0.326 |
| $M_{33}$ | 0.087 |
| $M_{34}$ (mm/mrad) | 2.153 |

TABLE 1-continued

Appendix A
Quadrupole Parameters

| | |
|---|---|
| $M_{43}$ (mrad/mm) | −0.454 |
| $M_{44}$ | 0.250 |

(Note: Quadrupoles 1,2,3 correspond to 54,56,58 in FIG. 1a)

Appendix B

REFERENCES

1. *Principles of Electrodynamics*, Melvin Schwartz [Dover Publications, Inc., N.Y. 1987] pp. 130–131.
2. "Strong Focusing Lenses", Albert Septier, [*Advances in Electronics and Electron Physics XIV*, Academic Press, 1961] pp. 85–203.
3. "Focusing with Quadrupoles, Doublets, and Triplets", E. Regenstreif [*Focusing of Charged Particles I*, ed. A. Septier, Academic Press 1967] pp. 400–402.
4. Danfysik, Jyllinge, Denmark.
5. Techron, Elkhart, Ind.; Copley Controls Corp., Newton, Mass.

What is claimed is:

1. An ion implantation system for doping a substrate, by irradiating a surface of the substrate with atomic or molecular ions by rapid scanning of a beam in two dimensions over the substrate, the system including:
    an end station for presenting a substrate to the ion beam,
    an ion source and associated beam-forming devices for producing a beam of atomic or molecular ions,
    a magnetic scanning system for deflecting the ion beam in two dimensions relative to a reference axis, said scanning system employing, for each dimension of scan, a single respective scanning magnet means formed of a yoke and pole means of magnetic material and associated energizing coils,
    and a magnetic ion beam transport system following the scanning system and preceding said end station, said transport system arranged to determine the angular relationship with which ions reach and are implanted into said substrate at said end station,
    said transport system arranged to receive the beam from the scanning system over the range of two dimensional deflections of said scanning system and constructed to impose static magnetic field conditions along the beam path of characteristics selected to reorient the two-dimensionally deflected beam to an implanting direction having a predetermined desired angular relationship with the axis in each of said two dimensions at the desired instantaneous two dimensional displacement of the beam from the axis, to produce the desired scan of the beam over the substrate.

2. The system of claim 1 wherein said magnetic scanning means, for at least one dimension of said scan, is constructed to scan the beam over the surface of said substrate at a frequency greater than 100 Hz.

3. The system of claim 1 wherein said magnetic ion transport system has characteristics to reorient the two-dimensionally deflected beam in each dimension in dimensionally decoupled manner.

4. The system of claim 1 wherein said scanning system includes:
    a first time-variable-field magnetic scanner for scanning the beam in the first dimension, and located axially downstream therefrom,
    a second time-variable-field magnetic scanner magnetically uncoupled from said first scanner for scanning the beam in the second dimension,
    the scanners effective at each instant to deflect the beam from said reference axis in a decoupled manner at respective angles in the respective dimensions that are determined by the desired instantaneous displacement of the beam on the substrate.

5. System for depositing atomic or molecular ions with a desired uniformity by rapid scanning of a beam over a wide range of perveance including perveance above $0.02/M[amu]^{\frac{1}{2}}$ (mA/keV$^{3/2}$) over the surface of a substrate, the system including:
    an end station supporting the substrate,
    an ion source for producing a beam of atomic or molecular ions,
    beam forming devices for producing a beam of atomic or molecular ions including a momentum analyzer for removing, from the beam, ions of unwanted momentum and an accelerator for establishing the desired final velocity of the ions,
    a magnetic scanning system for deflecting the beam in two dimensions relative to a reference axis; said scanning system including:
    first and second time-variable-field magnetic scanners in first and second positions along the axis of the system for successively deflecting the beam in respective dimensions, the first scanner constructed to rapidly scan the beam in the first dimension, said first scanner having a magnetic gap through which the beam passes of volume smaller than the volume of the magnetic gap of said second scanner and constructed to scan the beam more rapidly than the second scanner,
    the scanners effective at each instant to deflect the beam from said reference axis in a decoupled manner at respective angles in the respective dimensions that are determined by the desired instantaneous displacement of the beam on the substrate;
    each of said magnetic scanners comprised of yoke and pole means of magnetic material and associated energizing coils,
    and each having a respective deflection circuit and power supply for applying time-varying current to said coil,
    and a magnetic ion beam transport system following the scanners,
    said transport system arranged to receive the beam from the scanners over the range of two dimensional deflections of said scanners and constructed to impose static magnetic field conditions along the beam path of characteristics selected to reorient the two-dimensionally deflected beam in a dimensionally decoupled manner, to a direction having a predetermined desired angular relationship with the axis in said two directions at the desired instantaneous two dimensional displacement of the beam from the axis, to produce the desired scan of a beam spot of finite ion-distributing size over the substrate,
    said magnetic ion beam transport system constructed to provide at the substrate a beam of substantially constant beam size at said substrate in which directions of travel of the ions deviate by less than about 2° from a desired direction over the range of scan.

6. The system of claim 4 or 5 wherein the second scanner is located closely adjacent said first scanner without any beam-influencing optical element interposed therebetween.

7. The system of claim 4 or 5 wherein said first scanner is constructed to operate at a scanning frequency of the order of about ten times higher than, and not a rational multiple of, the scanning frequency of said second scanner.

8. The system of claim 4 or 5 constructed to provide a ribbon-form ion beam to said scanning system, the shorter dimension of the cross section of said ribbon being aligned with the direction of the thickness of the gap of said first scanner.

9. The system of claim 1 wherein scanner coils and associated magnetic circuits effective to generate fields to deflect the beam in decoupled manner in both dimensions are located in the same general vicinity along the beam path.

10. The system of claim 9 comprising a circular iron yoke, a multiplicity of poles distributed about and extending inwardly toward the axis of said yoke, and respective, separate x and y dimension deflection coils associated with said poles.

11. The system of claim 1, 4, 5, 9 or 10 wherein said beam-forming devices form a conjugate ion optical image of said ion source and said scanner system is positioned in the region of said image to keep relatively small the magnetic gaps of said scanning system.

12. The system of claim 1, 4, 5, 9 or 10 wherein poles and yoke structure of the magnetic scanning system are comprised of insulated laminations of magnetic material of thickness less than 1 mm.

13. The system of claim 12 wherein the thickness of said laminations is of the order of 0.5 mm.

14. The system of claim 1, 4, 5, 9 or 10 wherein said ion beam transport system comprises a solenoid system.

15. The system of claim 1, 4, 5, 9 or 10 wherein said scanning system further includes a power amplifier constructed to excite magnetic coils of said scanning system with desired substantially triangular current excitation waveforms.

16. The system of claim 15 wherein said power amplifier is constructed to produce a square voltage waveform that results in a substantially linear change of current applied to said scanning system over about 80% of half of a scan cycle.

17. The system of claim 1, 4, 5, 9 or 10 wherein the scanning system is constructed to deflect the beam in one dimension at a scan frequency of the order of 1000 Hz or higher and in the other dimension at a scan frequency of the order of 50 Hz or higher.

18. The system of claim 1, 4, 5, 9 or 10 constructed to enable scanning of beams over a wide range of perveance including perveances both substantially above and substantially below $0.02/M[amu]^{\frac{1}{2}}$ $(mA/keV^{3/2})$.

19. The system of claim 18 constructed to enable scanning of beams having high beam currents such as an arsenic beam of about 20 mA at low energies from 100 keV down to about 5 keV.

20. The system of claim 18 constructed to enable scanning of beams having high beam currents in the range of 10 to 20 mA at high energies of the order of 100 to 400 keV.

21. The system of claim 18 constructed to operate as an ion implanter for implantation of ions in a wafer including ions of boron, phosphorous, arsenic and antimony.

22. The system of claim 21 constructed to scan over an area having up to a 12 inch diameter.

23. The system of claim 21 constructed to produce a beam diameter of about 10 to 80 mm at the substrate.

24. The system of claim 23 constructed to complete multiple scans over a wafer up to 12 inches diameter such that an irradiation uniformity of better than 0.5% over the entire wafer is achieved in less than 10 seconds.

25. The system of claim 1, 4, 5, 9 or 10 including power amplifier means for driving a magnetic scanner of said scanning system, said power amplifier means producing a characteristic voltage ripple, the scan frequency of said scanner selected not to be a rational multiple of said characteristic voltage ripple.

26. The system of claim 1, 4, 5, 9 or 10 wherein said ion beam transport system includes a scanner system constructed to produce a raster scan.

27. The system of claim 1, 4, 5, 9 or 10 wherein said magnetic ion beam transport system includes a scanner system constructed to produce a rotating raster scan.

28. The system of claim 1, 4, 5, 9 or 10 wherein said ion beam transport system includes a scanner system constructed to produce a Lissajous motion.

29. System for irradiating a surface of a substrate with atomic or molecular ions by rapid scanning of a beam in two dimensions over the substrate, the system including:

an end station for presenting a substrate to the beam,
an ion source and associated beam-forming devices for producing a beam of atomic or molecular ions,
a magnetic scanning system for deflecting the beam in two dimensions relative to a reference axis, said system employing, for each dimension of scan, a single scanning magnet means formed of a yoke and pole means of magnetic material and associated energizing coils,
and a magnetic ion beam transport system following the scanning system,
said transport system arranged to receive the beam from the scanning system over the range of two dimensional deflections of said scanning system and constructed to impose magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, to produce the desired scan of the beam over the substrate, and wherein said scanning system includes:
a first time-variable-field magnetic scanner for scanning the beam in the first dimension, and located axially downstream therefrom,
a second time-variable-field magnetic scanner magnetically uncoupled from said first scanner for scanning the beam in the second dimension,
the scanners effective at each instant to deflect the beam from said reference axis in a decoupled manner at respective angles in the respective dimensions that are determined by the desired instantaneous displacement of the beam on the substrate,
and wherein the gap of said second scanner diverges in the axial direction in manner and direction corresponding to the divergence of the deflection envelope produced by the first scanner, while the width (direction perpendicular to the gap) of the poles of said second magnetic scanner correspondingly increases progressively in the axial direction.

30. System for irradiating a surface of a substrate with atomic or molecular ions by rapid scanning of a beam in two dimensions over the substrate, the system including:

an end station for presenting a substrate to the beam,
an ion source and associated beam-forming devices for producing a beam of atomic or molecular ions,
a magnetic scanning system for deflecting the beam in two dimensions relative to a reference axis, said system employing, for each dimensions of scan, a single scanning magnet means formed of a yoke and pole means of magnetic material and associated energizing coils,
and a magnetic ion beam transport system following the scanning system,
said transport system arranged to receive the beam from the scanning system over the range of two dimensional deflections of said scanning system and constructed to impose magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, to produce the desired scan of the beam over the substrate,
wherein scanner coils and associated magnetic circuits effective to generate fields to deflect the beam in decoupled manner in both dimensions are located in the same general vicinity along the beam path,
the magnetic scanning system comprising a circular iron yoke, a multiplicity of poles distributed about and extending inwardly toward the axis of said yoke, and respective, separate x and y dimension deflection coils associated with said poles, and
wherein the windings of the coils on the poles for the respective deflection directions vary in number according to the angular position of said poles relative to the respective deflection axis, and means to connect the respective sets of coils in series to be driven by a single, respective energization current for deflection in the respective dimension.

31. System for irradiating a surface of a substrate with atomic or molecular ions by rapid scanning of a beam in two dimensions over the substrate, the system including:

an end station for presenting a substrate to the beam,
an ion source and associated beam-forming devices for producing a beam of atomic or molecular ions,
a magnetic scanning system for deflecting the beam in two dimensions relative to a reference axis, said system employing, for each dimension of scan, a single scanning magnet means formed of a yoke and pole means of magnetic material and associated energizing coils,
and a magnetic ion beam transport system following the scanning system,
said transport system arranged to receive the beam from the scanning system over the range of two dimensional deflections of said scanning system and constructed to impose magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, to produce the desired scan of the beam over the substrate,
wherein said ion beam transport system is an electromagnet system for establishing static magnetic fields capable of effecting a linear transformation of the two-dimensionally deflected beam such that the final position and angle at which the beam impinges on the target is a linear function of the angular direction and displacement of the beam entering the ion beam transport system.

32. The system of claim 31 wherein said magnetic ion beam transport system is constructed to impose static magnetic field conditions along the beam path sufficient to produce a beam of ions such that the angular direction of each ion deviates by less than about 2° from the desired direction over the range of scan.

33. The system of claim 31 wherein said magnetic ion transport system has adjustable parameters for adjusting the angle of said beam upon said substrate over a range of diverging, parallel and converging values.

34. The system of claim 33 wherein said magnetic ion beam transport system imposes static magnetic field conditions to produce a beam that is parallel with said reference axis in said two dimensions.

35. The system of claim 31 wherein said magnetic ion beam transport system is constructed to impose static magnetic field conditions along the beam path to produce a beam that has a substantially constant ion-distributing spot size at said substrate over the range of scan.

36. The system of claim 35 wherein said magnetic ion transport system has adjustable parameters for adjusting the size of said beam at said substrate.

37. System for irradiating a surface of a substrate with atomic or molecular ions by rapid scanning of a beam in two dimensions over the substrate, the system including:

an end station for presenting a substrate to the beam,
an ion source and associated beam-forming devices for producing a beam of atomic or molecular ions,
a magnetic scanning system for deflecting the beam in two dimensions relative to a reference axis, said system employing, for each dimension of scan, a single scanning magnet means formed of a yoke and pole means of magnetic material and associated energizing coils,
and a magnetic ion beam transport system following the scanning system,
said transport system arranged to receive the beam from the scanning system over the range of two dimensional deflections of said scanning system and constructed to impose magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, to produce the desired scan of the beam over the substrate, wherein said scanning system includes:
a first time-variable-field magnetic scanner for scanning the beam in the first dimension, and located axially downstream therefrom,
a second time-variable-field magnetic scanner magnetically uncoupled from said first scanner for scanning the beam in the second dimension, the scanners effective at each instant to deflect the beam from said reference axis in a decoupled manner at respective angles in the respective dimensions that are determined by the desired instantaneous displacement of the beam on the substrate, and wherein said ion beam transport system comprises multiple, axially spaced-apart static magnetic field-imposing elements constructed to enable accommodation of the different axial positions of said scanners while producing linear transformation of the deflected beam to the desired angular relationship and displacement of the beam.

38. The system of claim 37 wherein said magnetic ion beam transport system includes means to apply at least one static quadrupole field followed by second magnetic means applying static magnetic fields effective in the two dimensions of deflection.

39. The system of claim 37 wherein said magnetic ion beam transport system includes means to apply, in sequence, at least three quadrupole fields of alternating polarity.

40. The system of claim 39 wherein said magnetic ion beam transport system comprises at least three quadrupole magnets in sequence.

41. The system of claim 39 wherein said magnetic ion beam transport system comprises a bending magnet having at least three differing sections along its length constructed to produce respective quadrupole fields of alternating polarity.

42. The system of claim 39 wherein the x and y dimension object points of said quadrupole field system occur respectively at the x and y dimension magnetic scanners in the manner to satisfy telecentric conditions.

43. The system of claim 39 wherein the parameters of said quadrupole fields are adjustable to change the ion-distributing spot size of the beam spot size at the substrate which then remains substantially constant over the scan.

44. The system of claim 39 wherein the parameters of said quadrupole system are adjustable to vary the beam angle at said substrate over a range of convergent, parallel and divergent relationships, with the selected relationship being maintained over the scan.

45. The system of claim 38 wherein said second magnetic means comprises a solenoid means.

46. The system of claim 45 wherein said solenoid means comprises adjacent solenoids of opposite polarity.

47. System for irradiating a surface of a substrate with atomic or molecular ions by rapid scanning of a beam in two dimensions over the substrate, the system including:

an end station for presenting a substrate to the beam,
an ion source and associated beam-forming devices for producing a beam of atomic or molecular ions,
a magnetic scanning system for deflecting the beam in two dimensions relative to a reference axis, said system employing, for each dimension of scan, a single scanning magnet means formed of a yoke and pole means of magnetic material and associated energizing coils,
and a magnetic ion beam transport system following the scanning system,
said transport system arranged to receive the beam from the scanning system over the range of two dimensional deflections of said scanning system and constructed to impose magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, to produce the desired scan of the beam over the substrate,
wherein said ion beam transport system comprises a solenoid system and wherein said solenoid system has multiple solenoids, the currents in said solenoids being controlled to control beam rotation.

48. The system of claim 47 further including means to adjust currents of said solenoids relative to each other to provide a desired, controlled amount of rotation.

49. The system of claim 46 wherein said solenoid system comprises a pair of solenoids having opposite current flows, whereby the second solenoid compensates for rotation of said beam by said first solenoid.

50. The system of claim 49 wherein the magnitudes of currents in said solenoids are equalized to prevent rotation of said beam.

51. System for irradiating a surface of a substrate with atomic or molecular ions by rapid scanning of a beam in two dimensions over the substrate, the system including:

an end station for presenting a substrate to the beam,
an ion source and associated beam-forming devices for producing a beam of atomic or molecular ions,
a magnetic scanning system for deflecting the beam in two dimensions relative to a reference axis, said system employing, for each dimension of scan, a single scanning magnet means formed of a yoke and pole means of magnetic material and associated energizing coils,
and a magnetic ion beam transport system following the scanning system,
said transport system arranged to receive the beam from the scanning system over the range of two dimensional deflections of said scanning system and constructed to impose magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, to produce the desired scan of the beam over the substrate,
wherein said ion beam transport system comprises a solenoid system,
and wherein said scanning system comprises first and second scanners that are located at different axial positions and said ion beam transport system further comprises a magnetic device to superimpose the virtual objects of the x and y dimension rays presented to said solenoid system.

52. System for irradiating a surface of a substrate with atomic or molecular ions by rapid scanning of a beam in two dimensions over the substrate, the system including:

an end station for presenting a substrate to the beam,
an ion source and associated beam-forming devices for producing a beam of atomic or molecular ions,
a magnetic scanning system for deflecting the beam in two dimensions relative to a reference axis, said system employing, for each dimension of scan, a single scanning magnet means formed of a yoke and pole means of magnetic material and associated energizing coils, and a magnetic ion beam transport system following the scanning system, said transport system arranged to receive the beam from the scanning system over the range of two dimensional deflections of said scanning system and constructed to impose magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, to produce the desired scan of the beam over the substrate, wherein said ion beam transport system comprises a solenoid system and wherein scanners for the first and second dimensions are substantially superimposed and said ion beam transport system comprises solely solenoid means.

53. System for irradiating a surface of a substrate with atomic or molecular ions by rapid scanning of a beam in two dimensions over the substrate, the system including:

an end station for presenting a substrate to the beam, an ion source and associated beam-forming devices for producing a beam of atomic or molecular ions, a magnetic scanning system for deflecting the beam in two dimensions relative to a reference axis, said system employing, for each dimension of scan, a single scanning magnet means formed of a yoke and pole means of magnetic material and associated energizing coils, and a magnetic ion beam transport system following the scanning system, said transport system arranged to receive the beam from the scanning system over the range of two dimensional deflections of said scanning system and constructed to impose magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, to produce the desired scan of the beam over the substrate, and wherein said magnetic ion beam transport system for imposing magnetic fields comprises a bending magnet followed by a quadrupole.

54. System for irradiating a surface of a substrate with atomic or molecular ions by rapid scanning of a beam in two dimensions over the substrate, the system including:

an end station for presenting a substrate to the beam, an ion source and associated beam-forming devices for producing a beam of atomic or molecular ions, a magnetic scanning system for deflecting the beam in two dimensions relative to a reference axis, said system employing, for each dimension of scan, a single scanning magnet means formed of a yoke and pole means of magnetic material and associated energizing coils, and a magnetic ion beam transport system following the scanning system, said transport system arranged to receive the beam from the scanning system over the range of two dimensional deflections of said scanning system and constructed to impose magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, to produce the desired scan of the beam over the substrate, and wherein said magnetic ion beam transport system for imposing magnetic fields comprises a bending magnet followed by at least one solenoid.

55. System for irradiating a surface of a substrate with atomic or molecular ions by rapid scanning of a beam providing an ion-distributing beam spot in two dimensions over the substrate, the system including:

an end station for presenting a substrate to the beam, an ion source and associated beam-forming devices for producing a beam of atomic or molecular ions, a magnetic scanning system for deflecting the beam in two dimensions relative to a reference axis, said system employing, for each dimension of scan, a single scanning magnet means formed of a yoke and pole means of magnetic material and associated energizing coils, and a magnetic ion beam transport system following the scanning system, said transport system arranged to receive the beam from the scanning system over the range of two dimensional deflections of said scanning system and constructed to impose static magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, and produce the desired scan of an ion beam spot of ion-distributing size over the substrate, and the system including a dynamic feedback control system including:

magnetic field detection means for detecting the magnetic fields of said scanning system and producing signals indicative of the fields affecting said beam during scanning of said ion beam;

and feedback control system for controlling the scanning system to produce a prescribed magnetic field profile in each of said two dimensions in a closed loop manner in response to said field detection means.

56. The system of claim 55 wherein said field detection means comprise inductive coils inside said magnetic scanning system.

57. The system of claim 55 wherein said control system includes means to perform analysis of signals from said magnetic field detection means into Fourier components and/or phase power series analysis.

58. System for irradiating a surface of a substrate with atomic or molecular ions by rapid scanning of a beam in two dimensions over the substrate, the system including:

an end station for presenting a substrate to the beam, an ion source and associated beam-forming devices for producing a beam of atomic or molecular ions, a magnetic scanning system for deflecting the beam in two dimensions relative to a reference axis, said system employing, for each dimension of scan, a single scanning magnet means formed of a yoke and pole means of magnetic material and associated energizing coils, and a magnetic ion beam transport system following the scanning system, said transport system arranged to receive the beam from the scanning system over the range of two dimensional deflections of said scanning system and constructed to impose static magnetic field conditions along the beam path of characteristics selected to reorient the two-dimensionally deflected beam to a direction having a predetermined desired angular relationship with the axis in said two dimensions at the desired instantaneous two dimensional displacement of the beam from the axis, to produce the desired scan of the beam over the substrate, and the system including a dynamic feedback control system including:

ion dose detection means for detecting the dose at the target of said scanning system and producing signals indicative of the dose during scanning of said ion beam;

and feedback control system for controlling the scanning system to produce a prescribed ion dose in said two dimensions in a closed loop manner in response to said dose detection means.

59. An ion implantation system for doping a substrate by irradiating a surface of the substrate with atomic or molecular ions with a desired uniformity the beam providing an ion-distributing beam spot, the system constructed to enable rapid scanning in two dimensions over the substrate of beams over a wide range of perveance including perveance above $0.02/M[amu]^{\frac{1}{2}}$ $(mA/keV^{3/2})$ and including:

an end station for presenting a substrate to the ion beam, an ion source and associated beam-forming devices for producing a beam of atomic or molecular ions, a magnetic scanning system capable of scanning said beam in two dimensions over the surface of the substrate, said scanning system employing, for each dimension of scan, a single respective scanning magnet means formed of yoke and pole means of magnetic material and associated energizing coils;

means for providing signals representing the desired position of said beam to produce a prescribed ion dose profile;

and a dynamic closed loop feedback control system including:

magnetic field detection means for detecting the magnetic fields of said scanning system and producing signals indicative of the fields affecting said beam during scanning of said beam, and feedback control system for controlling the scanning system to produce a magnetic field profile in said two dimensions in closed loop manner, in response to said field detection means to produce the desired scan of said ion-distributing beam spot.

60. The system of claim 58 wherein said field detection means comprise inductive coils inside said magnetic scanning system.

61. The system of claim 58 wherein said control system includes means to perform analysis of signals from said magnetic field detection means into Fourier components and/or phase power series analysis.

62. An ion implantation system for doping a substrate by irradiating a surface of the substrate with atomic or molecular ions with a desired uniformity, the beam providing an ion-distributing beam spot, the system constructed to enable rapid scanning in two dimensions over the substrate of beams over a wide range of perveance including perveance above $0.02/M[amu]^{\frac{1}{2}}$ $(mA/keV^{3/2})$ and including:

an end station for presenting a substrate to the beam, an ion source and associated beam-forming devices for producing a beam of atomic or molecular ions, a magnetic scanning system capable of scanning said beam in two dimensions over the surface of the substrate, said system employing, for each dimension of scan, a single respective scanning magnet means formed of yoke and pole means for magnetic material and associated energizing coils;

means for providing signals representing the desired position of said beam to produce a prescribed ion dose profile;

and a dynamic closed loop feedback control system including:

ion dose detection means for detecting the progress of implantation at the target of said scanning system and producing signals indicative thereof during scanning of said ion beam;

and feedback control system for controlling the scanning system to produce a prescribed ion dose in said two dimensions in a closed loop manner in response to said dose detection means.

63. A magnetic scanning system constructed to deflect a beam of atomic or molecular ions in a first and second dimension relative to a reference axis, said system having a first and second time-variable-field magnetic scanners in first and second positions along the axis of the system for successively deflecting the beam in the respective dimensions, each magnetic scanner comprising a yoke and pole means of magnetic material and associated energizing coils, and each having a respective deflection circuit and power supply for applying time-varying current to said coils, said first time-variable-field magnetic scanner having a magnetic gap through which the beam passes of volume smaller than the volume of the magnetic gap of said second scanner and being constructed to scan the beam in its respective dimension more rapidly than does the second scanner whereby the power requirement imposed by the higher frequency for the first scanner is ameliorated by the lower gap volume of said scanner, and the scanners being effective at each instant to deflect the ion beam from said reference axis in a decoupled manner at respective angles in the respective dimensions that are determined by the desired instantaneous displacement of the ion beam.

64. The system of claim 63 wherein the second scanner is located closely adjacent said first scanner without any beam-influencing optical element interposed therebetween.

65. The system of claim 63 including means to provide a ribbon-form ion beam to said scanning system, the shorter dimension of the cross section of said ribbon being aligned with the direction of the thickness of the gap of said first scanner.

66. The system of claim 63 wherein the gap of said second scanner diverges in the direction of the beam path in manner corresponding generally to the divergence of the deflection envelope produced by the first scanner, the width (direction perpendicular to the gap) of the poles of said second magnetic scanner correspondingly increasing progressively in the axial direction.

67. The system of claim 63 or 64 wherein said magnetic scanning means, for at least one dimension of scan, is constructed to scan the beam over the surface of said substrate at a frequency greater than 100 Hz.

68. The system of claim 63 wherein said first scanner is constructed to operate at a scanning frequency of the order of about ten times higher than, and not an integer multiple of, the scanning frequency of said second scanner.

69. The system of claim 63, 64 or 68 wherein the scanning system is constructed to deflect the beam in said first dimension at a scan frequency of the order of 1000 Hz or higher and in the second dimension at a scan frequency of the order of 50 Hz or higher.

70. A magnetic scanning system for deflecting a beam of atomic or molecular ions in a first and second dimension relative to a reference axis, said system employing respective first and second time-variable-field magnetic scanning magnet means formed of a yoke and pole means of magnetic material and associated energizing coils, and each having a respective deflection circuit and power supply for applying time varying current to said coils, said scanner coils and associated magnetic circuits being effective to generate fields to deflect the beam in decoupled manner in both dimensions and being located in the same general vicinity along the beam path, the pole means for each scanning dimensions comprising a relatively large number of poles that are spaced at different angles $\theta$ about the reference axis and have associated coil turns, the number of coil turns about respective poles for the first scan dimension being proportional to the value of $\cos \theta$ and the number of coil turns about respective poles for the second scan dimension being proportioned to the value of $\sin \theta$, the coil turns respecting each scan dimension being connected in series, whereby, by selection of the frequency, phase and amplitude of the time-varying current applied to each coil, differing desired scan patterns can be produced.

71. The system of claim 70 comprising a circular iron yoke, a multiplicity of poles distributed about and extending inwardly toward the axis of said yoke, and respective, separate x and y dimension deflection coils associated with said poles.

72. A magnetic scanning system for deflecting a beam of atomic or molecular ions in a first and second dimension relative to a reference axis, said system employing respective first and second time-variable-field magnetic scanning magnet means formed of a yoke and pole means of magnetic material and associated energizing coils, and each having a respective deflection circuit and power supply for applying time varying current to said coils, said scanning system comprising a circular iron yoke, a multiplicity of poles distributed about and extending inwardly toward the axis of said yoke, and respective, separate x and y dimension deflection coils associated with said poles, the windings of the coils on the poles for the respective deflection directions varying in number according to the angular position of said poles relative to the respective deflection axis, and means connecting the respective sets of coils in series to be driven by a single, respective energization current for deflection in the respective dimension, said scanner coils and associated magnetic circuits being effective to generate fields to deflect the beam in decoupled manner in both dimensions and being located in the same general vicinity along the beam path.

73. The system of claim 63 or 72 in combination with a beam forming device for producing a beam of said atomic or molecular ions to be scanned, wherein said scanning system is positioned in the region of a conjugate ion optical image of said beam forming device to keep relatively small the magnetic gaps of said scanning system.

74. The system of claim 63 or 72 wherein poles and yoke structure of said magnetic scanning system are comprised of insulated laminations of magnetic material of thickness less than 1 mm.

75. The system of claim 74 wherein the thickness of said laminations is of the order of 0.5 mm.

76. The system of claim 63 or 72 further comprising an ion beam transport system following the scanning system, arranged to receive the beam from the scanning system over the range of two dimensional deflections of said scanning system and constructed to impose static magnetic field conditions along the beam path of characteristics selected to reorient the two-dimensionally deflected beam to a direction having a predetermined desired angular relationship with the axis in each of said two dimensions at the desired instantaneous two dimensional displacement of the beam from the axis, to produce the desired scan of the beam.

77. A magnetic scanning system for deflecting a beam of atomic or molecular ions that provides an ion-distributing beam spot in a first and second dimension relative to a reference axis, said system employing respective first and second time-variable-field magnetic scanning magnet means formed of a yoke and pole means of magnetic material and associated energizing coils, and each having a respective deflection circuit and power supply for applying time varying current to said coils, said scanner coils and associated magnetic circuits being effective to generate fields to deflect the beam in decoupled manner in both dimensions and being located in the same general vicinity along the beam path, the system including a dynamic feedback control system comprising:

magnetic field detection means for detecting the magnetic fields of said scanning system and producing signals indicative of the fields affecting said ion beam during scanning of said beam;

and a feedback control system for controlling the scanning system to produce a prescribed ion dose profile in said two dimensions in a closed loop manner in response to said field detection means to produce the desired scan of said ion-distributing beam spot.

78. An ion implantation system for doping a substrate by irradiating a surface of the substrate with atomic or molecular ions by rapid scanning of a beam in two dimensions, the beam providing an ion-distributing beam spot, the system including:

an end station for presenting a substrate to the ion beam, a scanning system for deflecting the ion beam in two dimensions relative to a reference axis, and a magnetic ion beam transport system following the scanning system, and preceding said end station, said transport system arranged to determine the angular relationship with which ions reach and are implanted into said substrate of said end station, said magnetic transport system having multiple, axially spaced-apart static magnetic field-imposing elements constructed to impose static magnetic field conditions along the beam path of characteristics selected to reorient the two-dimensionally deflected ion beam to an implanting direction having a predetermined desired angular relationship with the axis in each of said two directions at the desired instantaneous two dimensional displacement of the ion beam from the axis, to produce the desired scan of the beam over the substrate.

79. The system of claim 78 wherein said magnetic ion transport system has characteristics to reorient the two-dimensionally deflected beam in a dimensionally decoupled manner.

80. The system of claim 78 wherein said ion beam transport system is constructed to establish static magnetic fields capable of effecting a linear transformation of the two-dimensionally deflected beam such that the final position and angle at which the beam impinges on the target is a linear function of the angular direction and displacement of the beam entering the ion beam transport system.

81. The system of claim 80 wherein said magnetic ion beam transport system is constructed to impose static magnetic field conditions along the beam path sufficient to produce a beam of ions such that the direction of each ion deviates by less than about 2° from a desired direction over the range of scan.

82. The system of claim 80 wherein said magnetic ion beam transport system has adjustable parameters for adjusting the angle of said beam upon said substrate over the range of diverging, parallel and converging values.

83. The system of claim 80 wherein said magnetic ion beam transport system imposes static magnetic field conditions to produce a beam that is parallel with said reference axis in said two dimensions.

84. The system of claim 80 wherein said magnetic ion beam transport system is constructed to impose static magnetic field conditions along the beam path to produce a beam that has a substantially constant ion-distributing spot size at said substrate over the range of scan.

85. The system of claim 78 wherein said magnetic ion beam transport system includes means to apply at least one static quadrupole field followed by second magnetic means applying static magnetic fields effective in the two dimensions of deflection.

86. The system of claim 85 wherein said magnetic ion beam transport system comprises at least three quadrupole magnets in sequence.

87. The system of claim 85 wherein said magnetic ion beam transport system comprises a bending magnet having at least three differing sections along its length constructed to produce respective quadrupole fields.

88. The system of claim 85 for use with x and y scanners that are spaced apart along the axis of the system wherein the x and y dimension object points of said quadrupole field system occur respectively at the x and y dimension magnetic scanners in the manner to satisfy telecentric conditions.

89. The system of claim 42 or 88 wherein said ion beam transport system has three quadrupoles, quad 1, quad 2 and quad 3 respectively, located, in succession, substantially as set forth in the following table:

| Quadrupole Parameters | |
|---|---|
| Locations Along the z-axis (m): | |
| 'x' Object Point to Quad 1 Entrance (p) | 0.25 |
| 'y' Object Point to Quad 1 Entrance (q) | 0.55 |
| Effective Length Quad 1 | 0.36 |
| Spacing Quad 2 to 3 | 0.10 |
| Effective Length Quad 3 | 0.60 |
| Spacing Quad 2 to 3 | 0.07 |
| Effective Length Quad 3 | 0.36 |
| Exit of Quad 3 to Wafer | 0.25 |
| 'y' Object Point to Wafer | 2.29 |
| Quad 1 Parameters for 200 keV $As^+$ Ions: | |
| Aperture Diameter (mm) | 200 |
| Width (mm) | 690 |
| Pole Tip Field (T) | 0.198 |
| Total Coil Power (kW) | 1.9 |
| Quad 2 Parameters for 200 keV $As^+$ Ions: | |
| Aperture Diameter (mm) | 280 |
| Width (mm) | 1000 |
| Pole Tip Field (T) | 0.321 |
| Total Coil Power (kW) | 7.8 |
| Quad 3 Parameters for 200 keV $As^+$ Ions: | |
| Aperture Diameter (mm) | 240 |
| Width (mm) | 820 |
| Pole Tip Field (T) | 0.243 |
| Total Coil Power (kW) | 3.1 |
| Transfer Matrix Elements from Entrance of Quad 1 to Target Substrate | |
| $M_{11}$ | 0.042 |
| $M_{12}$ (mm/mrad) | 0.756 |
| $M_{21}$ (mrad/mm) | −1.305 |
| $M_{22}$ | 0.326 |
| $M_{33}$ | 0.087 |
| $M_{34}$ (mm/mrad) | 2.153 |
| $M_{43}$ (mrad/mm) | −0.454 |
| $M_{44}$ | 0.250 |

90. The system of claim 85 wherein said second magnetic means comprises a solenoid means.

91. The system of claim 78 wherein said ion beam transport system comprises a solenoid system having multiple solenoids, the currents in said solenoids being controlled to control beam rotation.

92. The system of claim 78 wherein said magnetic ion beam transport system for imposing magnetic fields comprises a bending magnet followed by a quadrupole.

93. The system of claim 78 wherein said magnetic ion beam transport system for imposing magnetic fields comprises a bending magnet followed by at least one solenoid.

94. The system of any one of claims 78 to 93 wherein said scanned beam is scanned by a system comprising first and second scanners that are located at different axial positions and said transport system is constructed such that its focal planes in the respective dimensions accommodate to the difference in center location of said first and second scanners.

* * * * *